US010666025B2

(12) United States Patent
Pharne

(10) Patent No.: US 10,666,025 B2
(45) Date of Patent: May 26, 2020

(54) METHOD OF ASSEMBLYING A MOTOR CONTROL CENTER UNIT WITH RETRACTABLE STAB ASSEMBLY

(71) Applicant: Siemens Industry, Inc., Alpharetta, GA (US)

(72) Inventor: Ajit Pharne, Schaumburg, IL (US)

(73) Assignee: SIEMENS INDUSTRY, INC., Alpharetta, GA (US)

( * ) Notice: Subject to any disclaimer, the term of this patent is extended or adjusted under 35 U.S.C. 154(b) by 324 days.

(21) Appl. No.: 15/554,233

(22) PCT Filed: Feb. 11, 2016

(86) PCT No.: PCT/US2016/017437
§ 371 (c)(1),
(2) Date: Aug. 29, 2017

(87) PCT Pub. No.: WO2016/144473
PCT Pub. Date: Sep. 15, 2016

(65) Prior Publication Data
US 2018/0084662 A1    Mar. 22, 2018

Related U.S. Application Data

(63) Continuation-in-part of application No. PCT/US2015/019142, filed on Mar. 6, 2015.

(51) Int. Cl.
*H02B 11/133* (2006.01)
*H02B 1/36* (2006.01)
(Continued)

(52) U.S. Cl.
CPC ......... *H02B 11/133* (2013.01); *H01R 13/621* (2013.01); *H02B 1/36* (2013.01);
(Continued)

(58) Field of Classification Search
CPC ...... H02B 11/133; H02B 11/173; H02B 1/36; H02B 3/00; H02K 11/30; H02K 5/04; H05K 7/1414; H01R 13/621
See application file for complete search history.

(56) References Cited

U.S. PATENT DOCUMENTS

| 4,032,207 A | * | 6/1977 | Ericson | ............... | H01H 33/025 |
| | | | | | 439/262 |
| 4,051,335 A | * | 9/1977 | Ericson | ............... | H02B 11/133 |
| | | | | | 200/50.26 |

(Continued)

OTHER PUBLICATIONS

Eaton, "Rototract (TM) Remote Racking Operating Manual"_Instruction Leaflet IL04300001E, Jul. 2008.*

(Continued)

*Primary Examiner* — Peter Dungba Vo
*Assistant Examiner* — Jeffrey T Carley

(57) ABSTRACT

A motor control unit (MCU) and methods of operating and assembling the same are provided. The MCU includes a housing enclosing a retractable stab assembly (RSA) having stabs attached thereto. The MCU further includes a bracket assembly having a mount for securing the bracket assembly to the RSA, guiderails for slideably engaging the RSA to facilitate the extending and retracting motion, and a lead screw accessible via an opening in the front of the housing. Rotating the lead screw causes the RSA to extend and retract which engages and disengages the stabs. The MCU also includes a motor assembly having a drive motor coupled to a drive shaft. The motor rotates the shaft in response to control signals from a remote-device. The motor assembly attaches to the housing such that the rotation of the shaft in response to the signals rotates the lead screw to engage and disengage the stabs.

17 Claims, 17 Drawing Sheets

(51) Int. Cl.
*H02B 3/00* (2006.01)
*H02K 11/30* (2016.01)
*H01R 13/621* (2006.01)
*H02B 11/173* (2006.01)
*H02K 5/04* (2006.01)
*H05K 7/14* (2006.01)

(52) U.S. Cl.
CPC ............ *H02B 3/00* (2013.01); *H02B 11/173* (2013.01); *H02K 5/04* (2013.01); *H02K 11/30* (2016.01); *H05K 7/1414* (2013.01)

(56) References Cited

U.S. PATENT DOCUMENTS

| | | | | |
|---|---|---|---|---|
| 5,510,960 | A * | 4/1996 | Rosen | H01R 9/2425 361/624 |
| 6,414,839 | B1 * | 7/2002 | Derksen | H02B 11/24 200/50.22 |
| 7,965,493 | B2 * | 6/2011 | Leeman | H02B 1/36 361/608 |
| 8,519,660 | B1 * | 8/2013 | Ledbetter | B60R 1/072 318/255 |
| 8,553,394 | B2 * | 10/2013 | Hawkins | H02B 11/127 200/50.24 |
| 8,638,561 | B2 * | 1/2014 | Lehtola | H05K 7/1409 361/724 |
| 2008/0023211 | A1 * | 1/2008 | Yee | H02B 1/36 174/50.52 |
| 2008/0258667 | A1 * | 10/2008 | Morris | G01R 1/04 318/490 |
| 2009/0301851 | A1 * | 12/2009 | Morris | H01H 3/26 200/331 |
| 2011/0110049 | A1 | 5/2011 | Lehtola et al. | |
| 2011/0216508 | A1 * | 9/2011 | Faulkner | H02B 11/127 361/724 |
| 2013/0258103 | A1 * | 10/2013 | McClung | H01H 3/227 348/143 |
| 2014/0321067 | A1 * | 10/2014 | Leeman | H01R 13/00 361/728 |
| 2015/0380910 | A1 * | 12/2015 | Oneufer | H02B 1/46 361/622 |
| 2015/0382492 | A1 * | 12/2015 | Oneufer | H02B 1/36 312/295 |

OTHER PUBLICATIONS

PCT International Search Report and Written Opinion of International Searching Authority dated May 2, 2016 corresponding to PCT International Application No. PCT/US2016/017437 filed Feb. 11, 2016.

\* cited by examiner

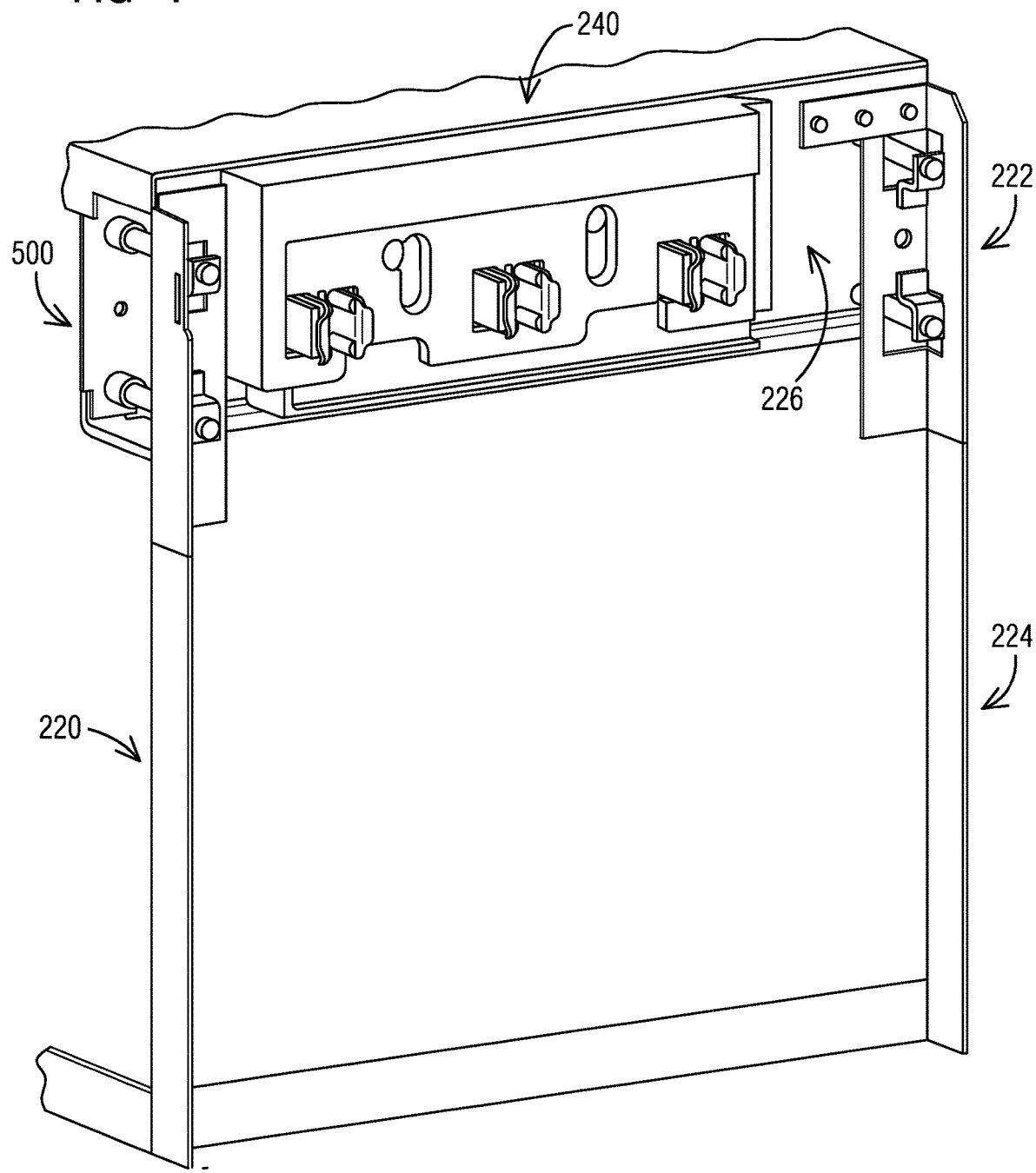

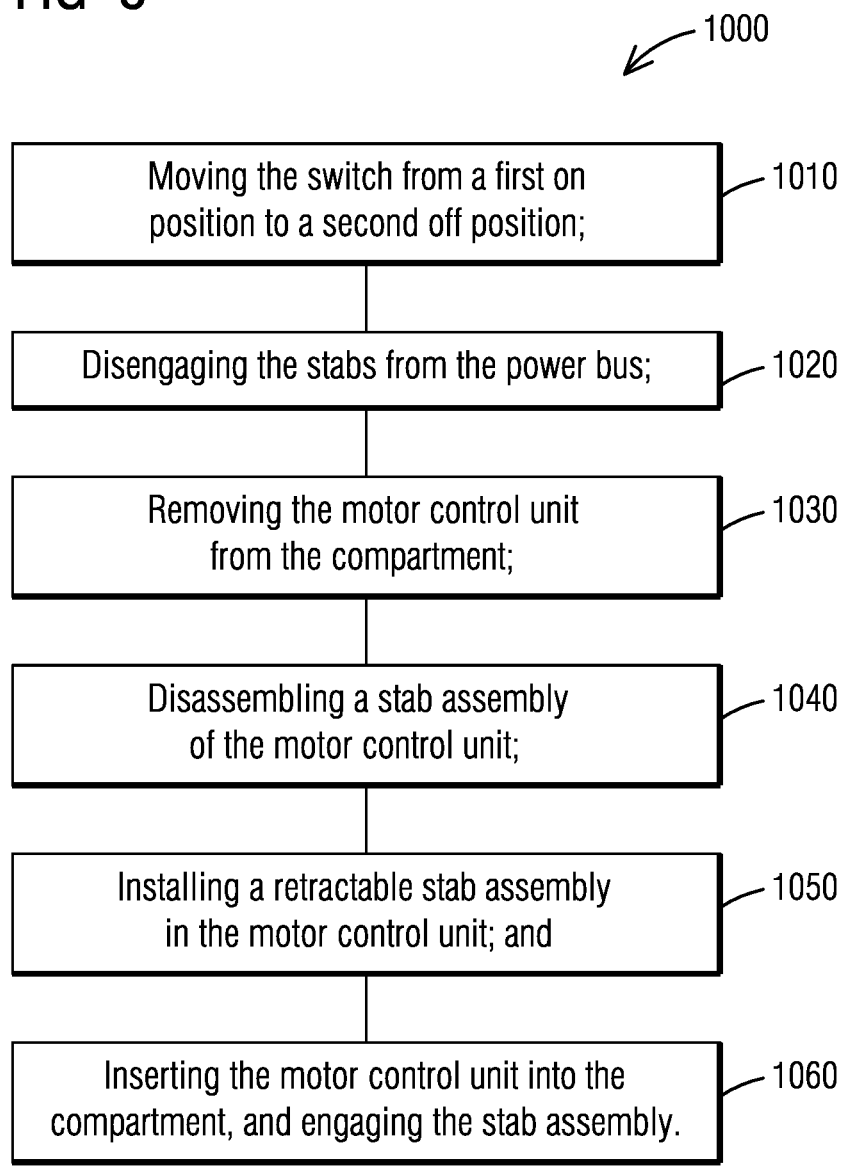

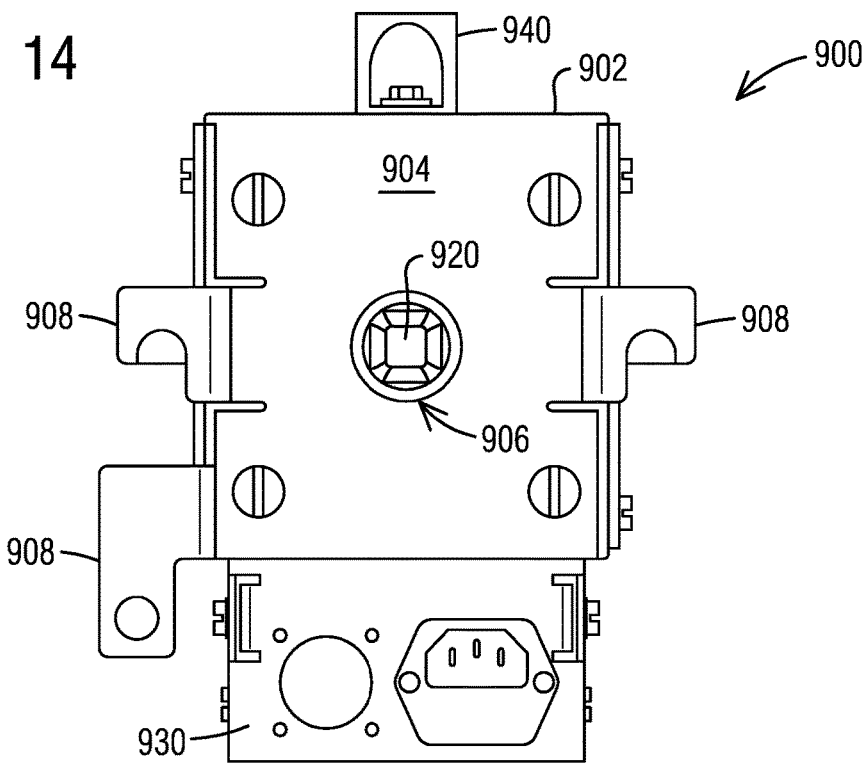

Selecting a control, via a pendant, to initiate a drive motor of a drive assembly which causes a drive shaft coupled to the drive motor to rotate in a first direction resulting in a retractable stab assembly shifting along one or more guide rails towards a power bus to engage stabs of the stab assembly with the power bus — 1510

Receiving confirmation, via the pendant, that the retractable stab assembly is extended such that the stabs are engaged with the power bus — 1520

Removing the motor assembly from the motorized control unit upon successful engagement of the stabs to the power bus — 1530

Attaching the motor assembly to the motorized unit and selecting a second control, via the pendant, to initiate the drive motor which causes the drive shaft to rotate in a second or further direction resulting in the stab assembly shifting along the guide rails away from the power bus to disengage the connected stabs from the power bus — 1540

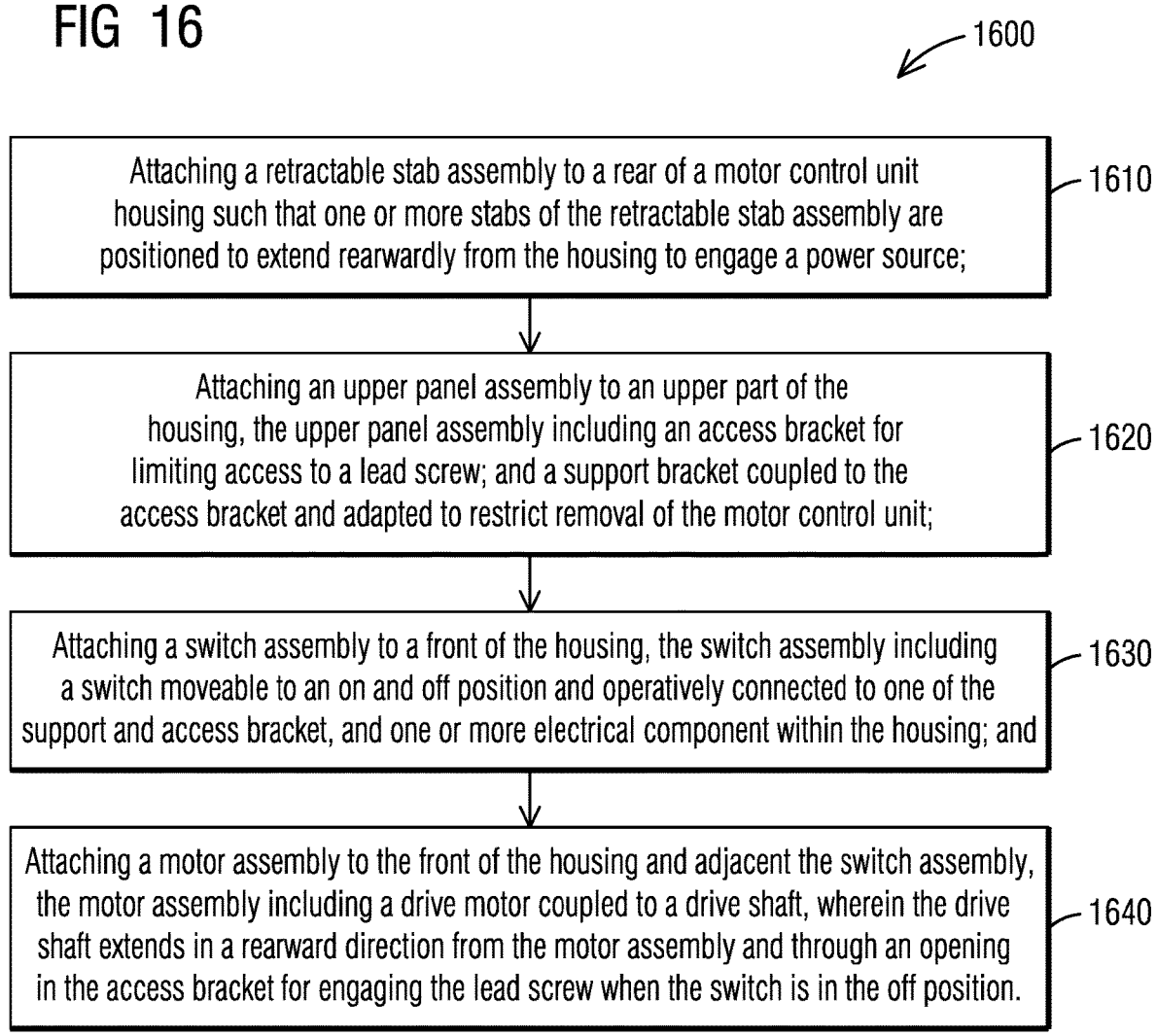

METHOD OF ASSEMBLYING A MOTOR CONTROL CENTER UNIT WITH RETRACTABLE STAB ASSEMBLY

CROSS-REFERENCE TO RELATED APPLICATIONS

This application is the U.S. national stage of International Application No.: PCT/US2016/017437 filed Feb. 11, 2016, and claims the benefit thereof, the entire content of which is hereby incorporated herein by reference. The International Application claims priority and the benefit of International Application No.: PCT/US2015/19142 filed Mar. 6, 2015, the disclosure of which is hereby incorporated by reference herein.

TECHNICAL FIELD

Aspects of the present invention relate generally to motor control centers (MCC), and more particularly, to MCC subunits, related stab assemblies, and methods for manufacturing and assembling the same.

BACKGROUND

A motor control center is a multi-compartment enclosure comprising a power bus system to distribute electrical power, on a common bus system, to one or more motor control units within the motor control center sections. The motor control units are typically constructed to be removable units that have individual sealed doors on the motor control center section. These motor control units may contain various motor control and motor protection components, such as motor controllers, starters, contactor assemblies, overload relays, circuit breakers, motor circuit protectors, various disconnects, and similar devices for electric motors. The motor control units connect to the supply power lines of the motor control center and supply power to the line side of the motor control devices, for operation of motors. Motor control centers are oftentimes used in factories and industrial facilities which utilize high power electrical motors, pumps, and other loads.

Typically, when installing or removing motor control units, the power supply lines are connected. To remove the motor control units, a door of the motor control unit or motor control center section is opened and an operator manually pulls the motor control unit to separate the conductive contacts or stabs from the bus system, thereby disconnecting the power supply. Installation of a motor control units are accomplished in a similar manner, whereby the operator manually pushes the bucket into a compartment of the motor control center section to engage the stabs with the bus system, thus connecting the system to supply power. In some instances, the stabs may be difficult to maneuver manually (push and pull) when an operator is supporting the entire bucket or when the stabs are not visible. These difficulties may lead to numerous hazards (e.g., shocks/misfires, an arc or arc flash) that may be harmful and dangerous to the operators. It would therefore be desirable to design, manufacture and assemble a motor control unit that overcomes the aforementioned difficulties.

SUMMARY

In an exemplary embodiment, a method for assembling a motor control unit for a motor control center is provided. The motor control unit generally includes a housing adapted to receive and/or enclose one or more electrical components therein. The method comprises the step of attaching a retractable stab assembly to a rear panel of the housing such any stabs of the retractable stab assembly are positioned to extend rearwardly therefrom and from the housing to engage a power source in the motor control center.

Assembling the retractable stab assembly includes the steps of mounting a bracket assembly to a stab housing having one or more slots for receiving stabs therebetween. The bracket assembly includes a mounting plate having one or more rail openings and secured to a side of the stab housing opposite the one or more slots. The bracket assembly further includes a rail bracket adapted to attach to a rear of the motor control unit and having one or more guide rails extending rearwardly therefrom. The guide rails may be at least partially disposed between the one or more rail openings. The bracket assembly also includes a lead screw bracket defining a first portion with a lead screw opening, and a second portion extending substantially perpendicularly from the first portion towards the rear of the motor control unit. The second portion is attached to a side of the mounting plate opposite the stab housing.

Assembling the retractable stab assembly further includes the step of securing a lead screw assembly to the bracket assembly. The lead screw assembly includes at least a lead screw having a head and body portion, a nut having an opening for receiving the lead screw therebetween, and a stopper adapted to interface with the body portion. The nut may be mounted to the first portion of the lead screw bracket such that the nut opening is aligned with the lead screw opening. Additionally, the body portion of the lead screw is inserted through the lead screw opening and the nut opening and is secured to the second stopper at an end of the body portion to restrict movement of the lead screw beyond the stopper. It should be appreciated that the lead screw is rotatable such that rotation of the lead screw may shift the first portion and attached nut along the body portion of the lead screw, e.g., in operation. It should further be appreciated that the motor control unit may be one of a 12, 18, 24, 30, 36, 42, 48, 54, and 60 inch unit, and that in a further embodiment, the rear panels of each of the units may include an opening adapted for the stab assembly and/or one or more stabs of the retractable stab assembly to at least partially extend rearwardly therethrough. It should also be appreciated that the openings of each size unit, and more particularly, the opening of the rear panel, may be similarly dimensioned, or differently dimensioned.

In another exemplary embodiment, the method for assembling the motor control unit further includes the step of attaching an upper panel assembly to an upper part of the housing, attaching a switch assembly to a front of the housing, and attaching a motor assembly to the front of the housing and adjacent to the switch assembly. The switch assembly includes a switch moveable to an on and off position and operatively connected the upper assembly, or more particularly, a support and access bracket of the upper assembly, and the electrical components of the housing for controlling power flowing to the electrical components from the power source. Additionally the switch assembly includes a lead screw access opening adapted to provide access to the lead screw within the housing. The motor assembly includes a drive motor coupled to a drive shaft. The drive shaft extends in a rearward direction from the motor assembly and through a lead screw access opening in the front of the housing to engage the lead screw.

BRIEF DESCRIPTION OF THE DRAWINGS

FIG. 4 illustrates a perspective view of the motor control unit back panel, in accordance with the disclosure provided herein;

FIG. 8 illustrates a flow chart for a process of disengaging stabs of a motor control unit, in accordance with the disclosure provided herein;

FIG. 14 illustrates a rear perspective view of an embodiment of the motor assembly, in accordance with the disclosure provided herein;

FIG. 15 illustrates a flow chart for a process of disengaging stabs of an exemplary embodiment of the motorized control unit, in accordance with the disclosure provided herein; and FIG. 16 illustrates a flow chart for a method of assembling a motor control unit, in accordance with the disclosure provided herein.

DETAILED DESCRIPTION

Figure 1:
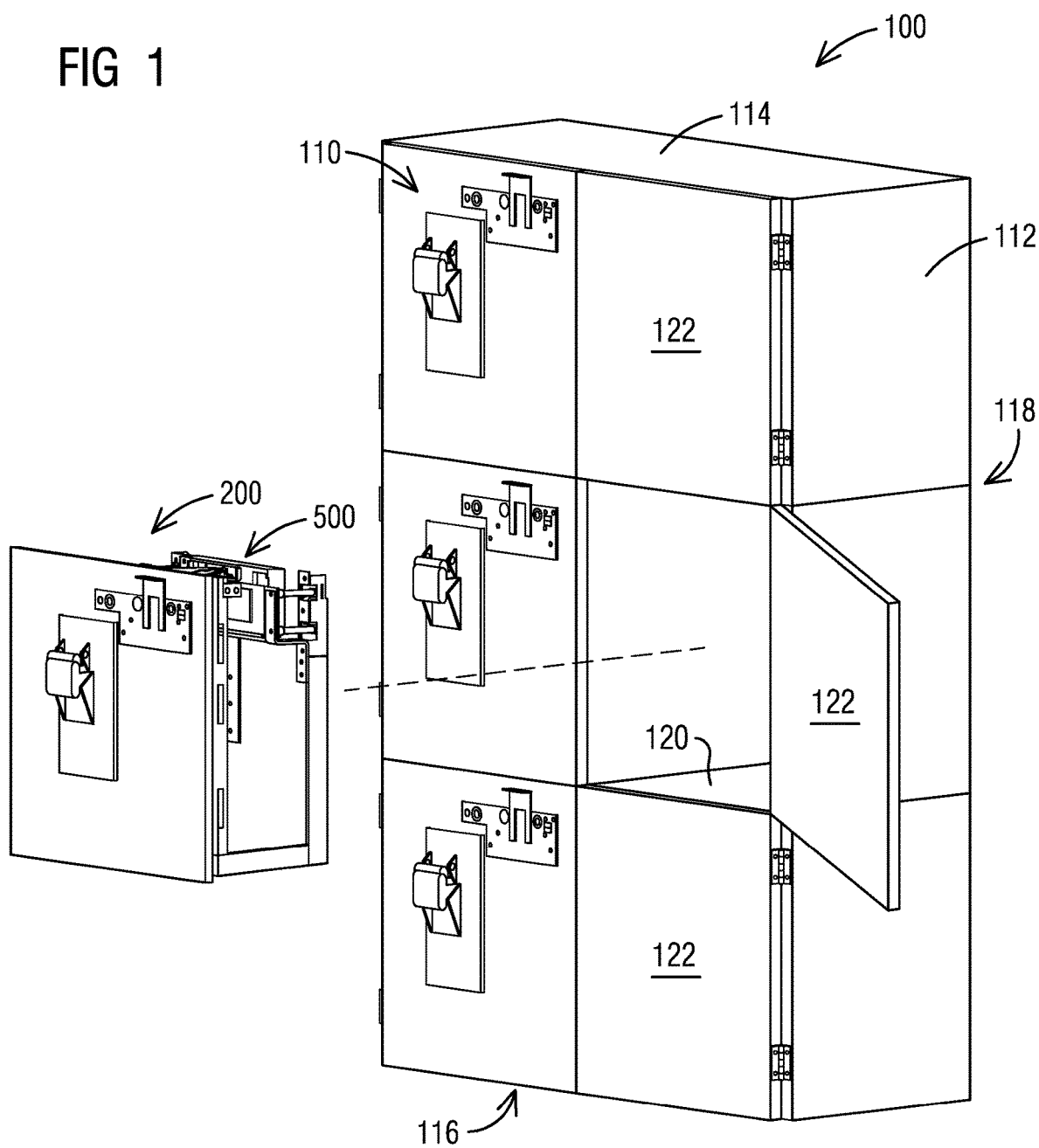
FIG. 1 illustrates a perspective exploded view of a motor control center having a motor control unit with retractable stab assembly, in accordance with the disclosure provided herein.

Referring now to the drawings wherein the showings are for purposes of illustrating embodiments of the subject matter herein only and not for limiting the same, FIG. 1 illustrates a side perspective view of a motor control center (MCC) 100. The MCC 100 includes one or more MCC sections 110 configured to house one or more motor control units (MCU) 200. The MCC section 110 may be generally rectangular in shape, and includes a plurality of panels arranged to compartmentalize the MCC section 110. For example, each MCC section 110 may include a pair of opposed side panels 112, a top 114 and bottom panel 116, a back panel 118, and one or more intermediate panels 120 arranged such that the panels collectively define one or more openings or compartments 124 adapted for at least partially receiving the MCU 200 therein.

In a further embodiment, the MCC section 110 may include a door panel 122 for encapsulating the MCU 200 within the defined opening of the MCC section 110. The door panel 122 may be one of the panels of the MCU 200. In an embodiment where multiple MCC sections 110 are provided, one or more of the above panels may be common between or across the multiple MCC sections 110. The panels may be constructed from a single piece of material having a common surface (e.g., sheet metal), or a plurality of sheets, frames and interlocking assemblies adapted to selectively mount together for providing a panel-like structure. The frames and interlocking assemblies may be selectively mounted by a fastening means. In an exemplary embodiment, the fastening means may be, for example, one or more screws, nuts and bolts, and rivets applied via mechanical fastening process through one or more apertures and/or connecting points of the sheets, frames, and interlocking assemblies. Alternatively, the fastening means may be applied via a more permanent-like mounting process, e.g., welding. A combination of both processes may also be used to achieve the desired arrangement for panels of the MCC section 110, or for arranging and/or assembling the panels and assemblies described herein. The MCC section 110 may further include one or more power buses 702 (see FIG. 7A) vertically or horizontally arranged at the rear of the MCC section 110, at or proximate to the back panel 118. In a further embodiment, where the one or more power buses 702 is arranged in the back panel 118, the back panel 118 may be a separate power bus housing 700 (see FIG. 7A) as described herein, which may be operably connected to the MCC section 110. The power bus 702 is adapted to interface with one or more components of the MCU 200 for providing power to the same.

Figure 2:
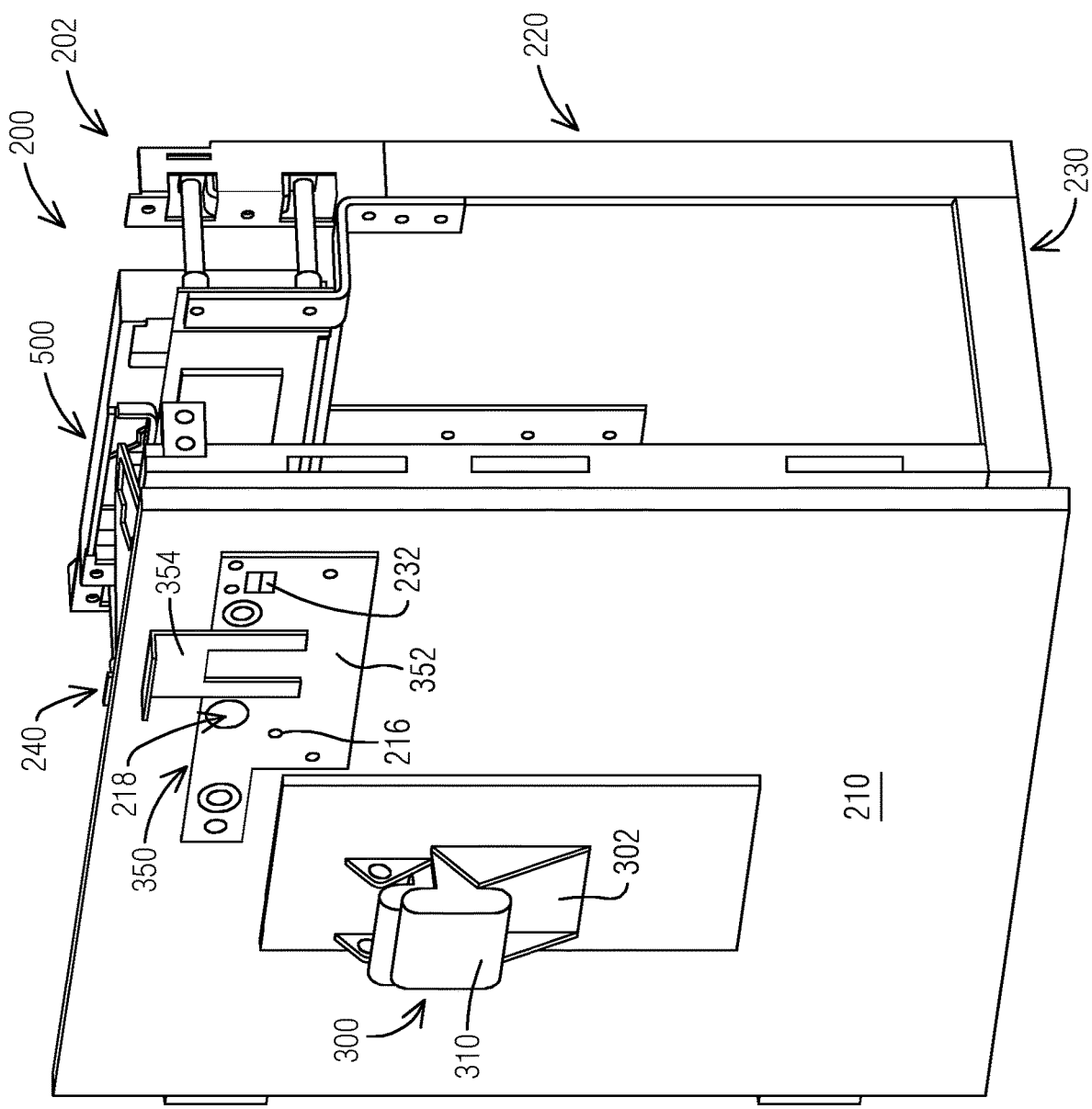
FIG. 2 illustrates a perspective view of the motor control unit with retractable stab assembly, in accordance with the disclosure provided herein.

With continued reference to FIG. 1, and now FIG. 2, a perspective view of an embodiment of the MCU 200 with retractable stab assembly 500 is provided. The MCU 200 comprises a housing 202 shaped for being at least partially received within the compartment 124 of the MCC section 110. The housing 202 may be made up of one or more panels and/or assemblies configured for removably securing the MCU 200 within the MCC section 110, and to partially or fully enclose one or more components therein. In the embodiment of FIG. 2, the MCU 200 can include a front panel 210, a back panel 220, a lower panel 230, and an upper panel 240. Similar to the panels of the MCC section 110, the panels of the MCU 200 may be made from a single piece of material or plurality of frames and/or interlocking assemblies selectively mounted to one another by the fastening means discussed herein, or by any means known to persons of ordinary skill in the art. When assembled, the panels of the housing 202 may define a shape (e.g., generally rectangular) adapted to be removably secured within the MCC section 110, and to have one or more electrical components and/or assemblies mounted therein. Examples of electrical components may include, among other assemblies that will be discussed below, a contactor or a solid-state motor controller, overload relays to protect the motor, fuses or a circuit breaker to isolate a motor circuit, or combinations thereof.

With continue reference to the figures, the front panel 210 may include one or more openings arranged in a non-uniform or uniform manner, and for at least partially receiving therebetween one or more assemblies. FIG. 2 illustrates a switch assembly opening (not shown) having a switch assembly 300 at least partially installed therebetween, and a motor assembly opening (not shown) for receiving, e.g., an embodiment of a panel assembly 350 partially installed therebetween. Additional openings may also be provided for at least partially receiving a fastening means therebetween for selectively mounting the front panel 210 to one or more of the other panels of the MCU 200. In one embodiment, the openings may be one or more fastening apertures 216 or recesses extending at least partially through the front panel 210 for receiving the fastening means, and arranged to correspond with fastening apertures and/or recesses of the other panels. The fastening apertures 216 may include a threaded portion that corresponds to a threaded portion of the fastening means (e.g., threaded screw).

In a further embodiment, the front panel 210 may include a lead screw access opening 218 for providing access to a lead screw assembly 600, for example, when the front panel 210 is in a closed position. In an exemplary embodiment, the lead screw access opening 218 may be its own opening in the front panel 210, or in a further embodiment, an opening in a drive panel 352 of the panel assembly 350. In yet a further embodiment, the front panel 210 may include an indicator opening 232 for viewing one or more status indications for the MCU 200, e.g., engaged or disengaged stabs status, live unit status, lock status etc. Similar to the lead screw access opening 218, the indicator opening 232 may be its own opening on the front panel 210, or an opening on one or more assemblies, e.g., switch assembly 300. The front panel 210 may further include one or more hinge assemblies 222 for mounting one side of the front panel 210 to one of the side panels (not shown) of the MCU 200, a structure of the MCC section 110, or in certain configurations, both.

As previously disclosed, the drive panel 352 may include one or more openings for providing access to the lead screw 610. The drive panel 352 may further include additional openings, for example, fastening apertures for fastening the drive panel 352 to the front panel 210 or other panels of the MCU 200. The panel assembly 350 may further include one or more panel covers 354 for covering the openings of the drive panel 352. For example, FIG. 2 shows one panel cover 354 for covering the lead screw access opening 218. The panel cover 354 may include one or more openings 356 for at least partially receiving a fastening means therebetween, and for slideably mounting the panel cover 354 to the drive panel 352 or front panel 210.

With continued reference to the figures, the switch assembly 300 may include a switch panel 302 having a switch opening 304 for at least partially receiving a switch 310 therebetween. The switch panel 302 may include additional openings similar to the openings of the drive panel 352, e.g., fastening apertures for fastening the switch panel to the front panel 210, indicator openings 232 or lead screw access openings 218. The switch 310 may be operably connected to a switch control board, circuit breaker, or the like, having one or more components for powering on/off one or more electrical components of the MCU 200. For example, as described herein, in one embodiment, the switch 310 may control the operability any motor attached to the MCU 200 by controlling limiting motors ability to rotate the lead screw 610 to extend or retract the stab assembly 500.

In a further embodiment, the switch 310 may be operably connected to one or more components, frames or interlocks in an upper panel assembly 400 (FIG. 3). In this embodiment, the switch assembly 300 may include one or more frames or interlocks (not shown) selectively attached or fastened by a fastening means to one or more frames or interlocks of the upper panel assembly 400 for shifting the upper panel assembly 400 from a first position to a second position. For example, when the switch 300 is in the live position, access to the lead screw 610 is restricted with the upper panel assembly 400 in the first position (FIG. 3B), whereas access to the lead screw 610 is provided with the switch in the off/dead position and the upper panel assembly 400 in the second position (FIG. 3C).

Figure 3A:
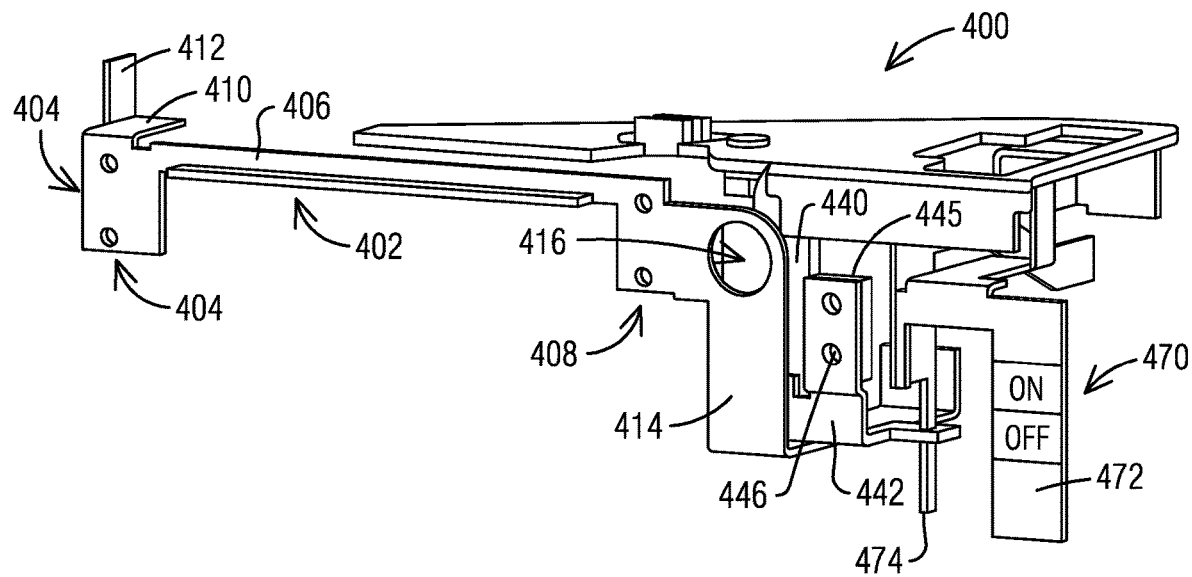
FIG. 3A illustrates a schematic, perspective view of an upper panel assembly of the motor control unit, in accordance with the disclosure provided herein.

Referring now to FIGS. 3A-3D, an embodiment of the upper panel 240 is provided of the MCU 200 is provided. The upper panel 240 may be formed from a single-piece of material in one embodiment, e.g., sheet metal, or in another embodiment, or a combination of both. In an embodiment where the upper panel 240 is formed from one or more frames and interlocking assemblies coupled together, the one or more frames and interlocking assemblies coupled together make up the upper panel assembly 400. The upper panel assembly 400 may be configured such that at least a portion thereof is operably moveable from a first position to a second position, e.g., upwards or downwards. In the embodiment of FIG. 3A, the upper panel assembly 400 includes a first support bracket 402 comprising a first portion 404, a second intermediate portion 406, and a third portion 408. The first portion 404 and third portion 408 are connected via the second intermediate portion 406, and at least partially extends in a first direction, e.g., downwardly, beyond the second intermediate portion 406.

In one embodiment, the first 404, second 406, and third portion 408 may be individual frames or interlocks connected via, for example, a fastening means as described herein, or in another embodiment, the portions may be integral formed. In a further embodiment, the portions may be formed from a single piece of material have one or more bends (i.e., bent portions) defining the first 404, second 406, and third portions 408. The first portion 404, second portion 406, and third portion 408 can further include one or more fastening apertures adapted to receive a fastening means therebetween for operably coupling the upper panel assembly 400 to one or more other frames or assemblies of the MCU 200, for example, the switch assembly 300.

The first portion 404 may further include a first extension 410. The first extension 410 may be positioned substantially perpendicular to the first portion 404, such that it extends in a rearward direction from the first portion 404 towards the back panel 220. The first extension 410 may be formed from the same piece of material as the first portion 404, or coupled to the first portion 404 by a fastening means. As illustrated in FIG. 3A, the first extension 410 can be formed from the same piece of material, and is bent in a substantially rearward direction from the first portion 404. The first extension 410 may further include a first restrictor piece 412. The first restrictor piece 412 may extend substantially perpendicularly to the first extension 410 in an upward direction e.g., protruding upwardly. As shown exemplarily in FIG. 3A, the first restrictor piece 412 extends from one side of the first extension 410. The first restrictor piece 412 may be formed from the same piece of material as the first extension 410, or be coupled to the first extension 410 by a fastening means, or any other means known to persons having ordinary skill in the art. In an embodiment where the first extension 410 and the first restrictor piece 412 are formed from the same piece of material, the first restrictor piece 412 may be bent to the desired substantially perpendicular position. In operation, for example, when the MCU 200 is live (i.e., the stabs 520 are engaged), the first restrictor piece 412 may be operably adapted to limit or restrict movement of the MCU 200 from the MCC section 110.

The third portion 408 may include a means for accessing a lead screw 610. As shown in FIG. 3A, the means for accessing the lead screw can be an access bracket 414 having one or more access bracket openings 416 adapted or sized to provide access to the lead screw 610, or in a further non-limiting embodiment, for receiving e a lead screw tool (not shown) for adjusting the lead screw 610 at least partially therebetween. The access bracket 414 may be made from one or more frames selectively attached to form the access bracket 414, as shown in FIG. 3A, or the access bracket 414 may be made from a single piece of material, similar to the material of the third portion 408. The access bracket 414 may be selectively attached to the third portion 408 by the fastening means disclosed herein or by any means known to person of ordinary skill in the art. Additionally, the access bracket 414 may be integrally formed with at least a portion of the third portion 408. As used herein, integrally formed means to couple such that the pieces are relatively permanently joined. In one embodiment, the access bracket 414 may extend in a generally downward direction, opposite from the direction of the first restrictor piece 412. Additionally, the access bracket 414 may be bent such that at least a portion of the access bracket 414, i.e., a first bent portion 418, extends in a substantially rearward direction towards the back panel 220. The access bracket 414 may be bent further, i.e., includes a second bend, such that at least a portion of the access bracket 414 i.e., the second bent portion 420, extends in a substantially upward, similar to the direction of the first restrictor piece 412. This second bent portion 420 of the access bracket may be operable to restrict movement of the stab assembly 500 in instances where the stabs 520 may be partially engaged.

In operation, at least a portion of the upper panel assembly 400 (e.g., access bracket 414) can shift in a relatively upwards or downwards direction for aligning the access bracket opening 416 with the lead screw access opening 218. Shifting of the access bracket 414 may correspond to the live/dead status of the MCU 200, i.e., turning on or off the switch 310. For example, when an installed MCU 200 is in the live status, i.e., the switch 310 is on, the upper panel assembly 400 may in a first position to restrict movement of the MCU 200 and limit access to the lead screw assembly 600. When an operator switches off the switch 310, at least a portion of the upper panel assembly 400 may shift from a first position (FIG. 3B) to a second position (FIG. 3C), thereby providing access to the lead screw assembly 600, and allowing for the MCU 200 to be removed once the stabs 520 are disengaged.

Referring to FIG. 4, a perspective view of an embodiment of the back panel 220 of the MCU 200 is illustrated. The back panel 220 may be constructed from a material similar to that of the other panels of the MCU 200, and may include a plurality of openings, e.g., apertures, for receiving a means for selectively attaching (e.g., the fastening means) the back panel 220 to one or more of the other panels of the MCU 200. In the embodiment of FIG. 3, the back panel 220 includes an upper portion 222 and a lower portion 224. The upper portion 222 and lower portion 224 may be formed from a single piece of material, or be formed from multiple pieces of materials connected to one another by, for example, the fastening means disclosed herein. In either configuration of the back panel 220, single or multi-piece construction, the upper portion 222 may include an opening 226 adapted for at least partially having the stab assembly 500 extending outward therefrom. In one embodiment, the stab assembly 500 may be the upper portion 222 of the back panel 220, and may be selectively fastened to the lower portion 224 by the fastening means described herein, or by any means known to persons of ordinary skill in the art and capable of selectively attaching the stab assembly 500 to the lower portion 224.

It should be appreciated that the openings 226 defined for the stab assembly 500 in the MCU 200, or more particularly, the back panel 220, may be the same size regardless of the size of the MCU 200, e.g., a 12, 18, 24, 30, 36, 42, 48, 54, or 60 inch tall unit, etc. That is, while the dimensions, e.g., height, width, depth, of the MCU 200 may differ, the openings 226 for any size MCUs 200 may be the same, which allows for the modular retractable stab assembly 500 to be mass produced. It should further be appreciated that the upper panel assembly 400 (FIG. 3A) or other sub-assembly disclosed herein may also be mass produced to fit any size MCU 200.

Figure 6A:
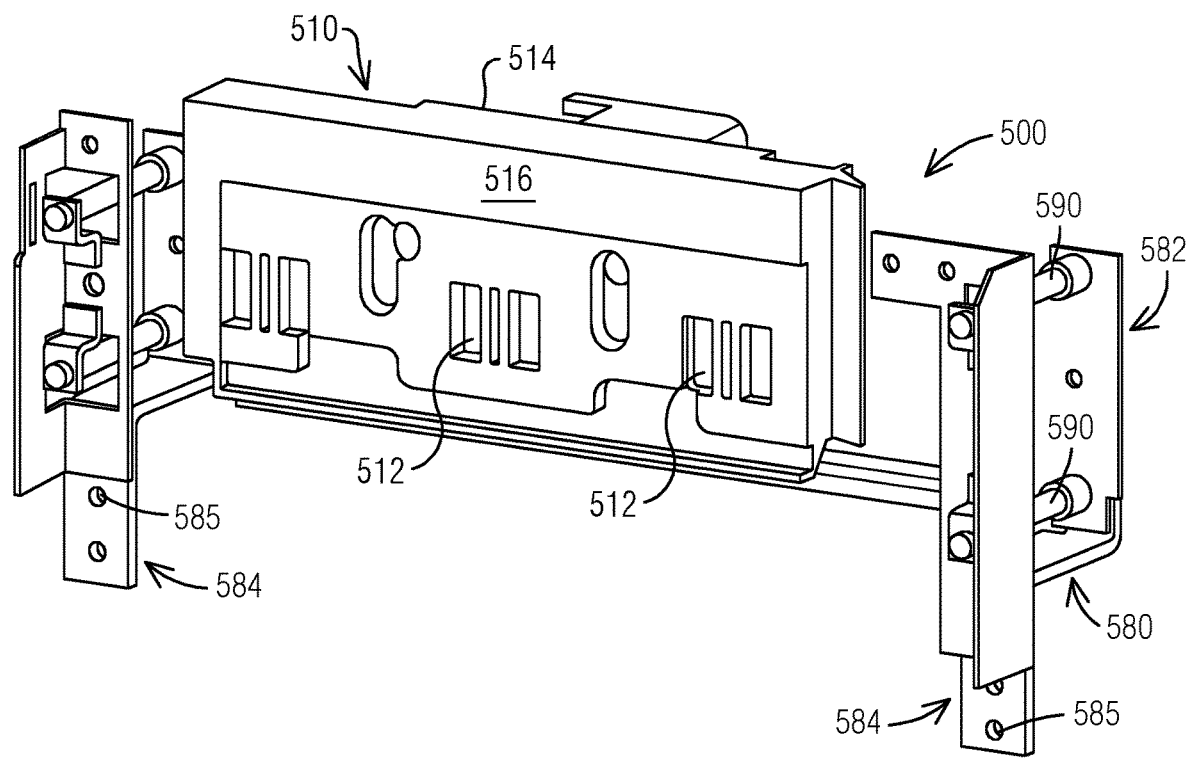
FIG. 6A illustrates a schematic, perspective view of a retractable stab assembly, in accordance with the disclosure provided herein.
Figure 6B:
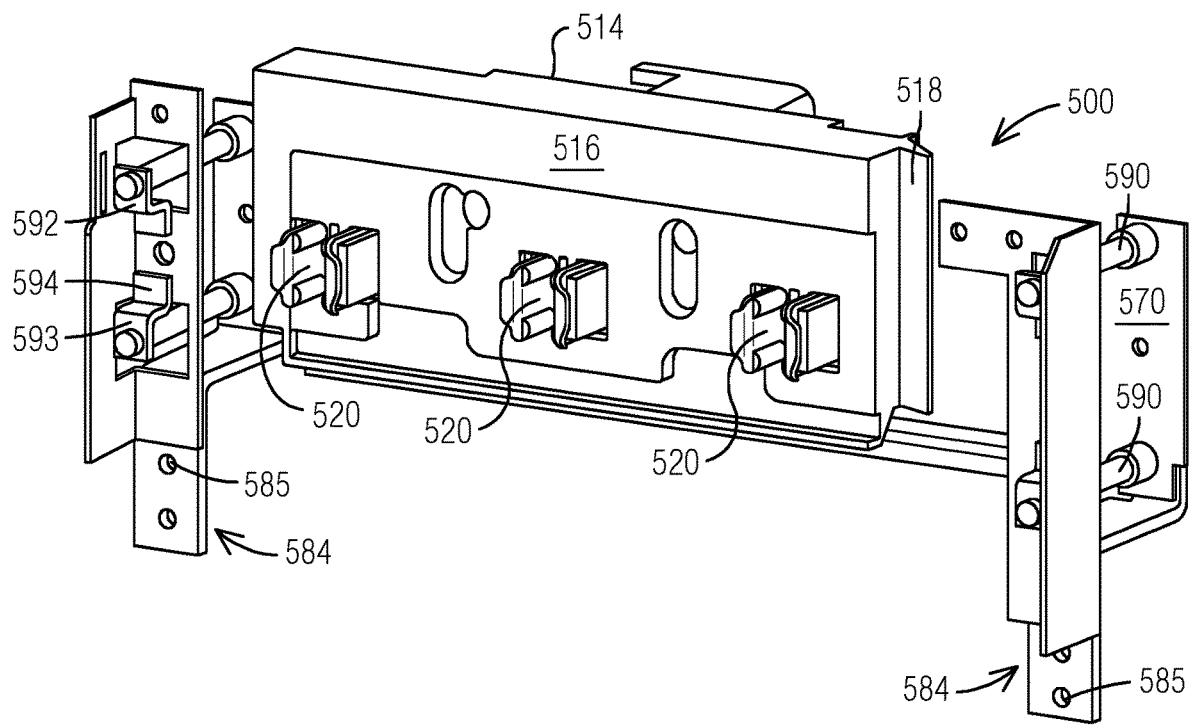
FIG. 6B illustrates another schematic, perspective view of the stab assembly of FIG. 6A.
Figure 6C:
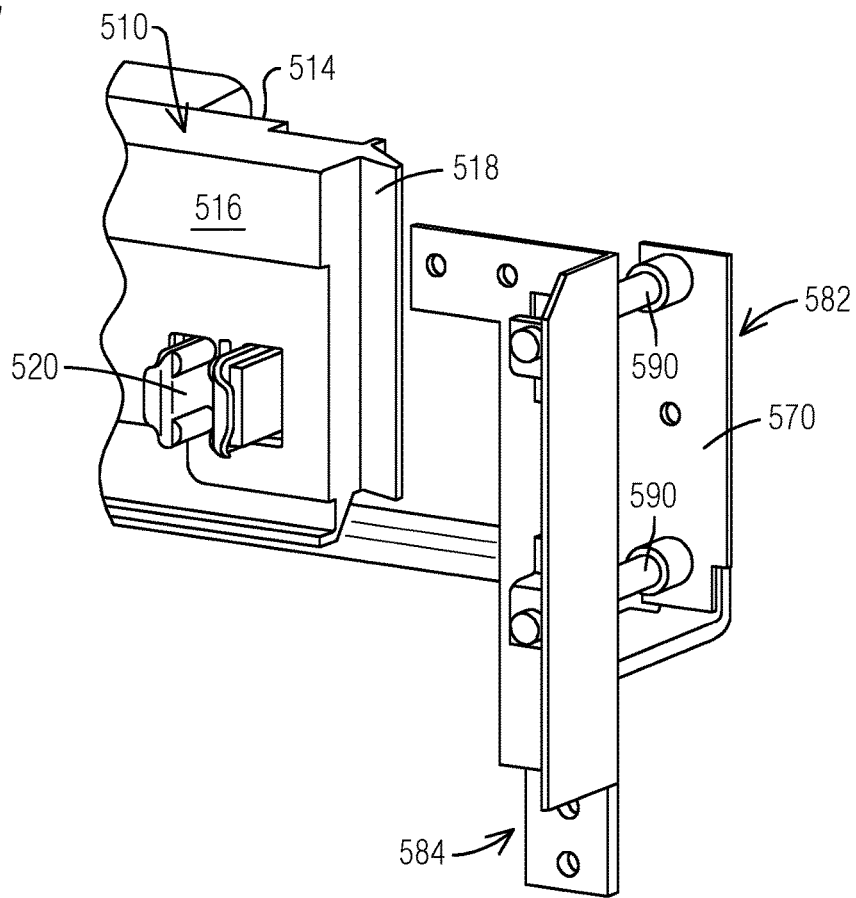
FIG. 6C illustrates a further schematic, perspective view of the stab assembly of FIG. 6A.

Referring now to FIGS. 6A-6C, an embodiment of a means for electrically disconnecting the MCU 200 from one or more power buses 702 in shown. The means for electrically disconnecting the MCU 200, in an exemplary embodiment, may be the retractable stab assembly 500. The stab assembly 500 may include a stab housing 510 having one or more openings or slots 512 adapted to at least partially receive therein or have attached thereto one or more conductive contacts or stabs 510 (FIG. 6B). The stab housing 510 may be made from a rigid polymer having electrical properties, or any material known to persons of ordinary skill in the art and capable of having one or more stabs 520 fixedly attaching thereto. The stab housing 510 may be formed from a first housing section 514 having one or more fastening apertures or recesses (not shown) for removably attaching one or more stabs thereto, and a second housing section 516 adapted to at least partially mate with the first housing section 514. The second housing section 516 is the outermost portion of the stab housing 510, and may be frictionally fitted to the first housing section 514, or selectively attached thereto via a fastening means. The second housing section 516 may further include a means for accessing a power bus.

The means for accessing a power bus may be a access shoulder 518 extending in a rearward direction from one side of the stab housing 510, e.g., the second housing section 516 in FIG. 6C, and be adapted to operatively engage at least a portion of a shutter assembly 710 (FIG. 7A) for moving one or more shutters of the shutter assembly 710 from a first closed position (FIG. 7B) to a second open position (FIG. 7A) to allow for one or more stabs 520 to engage with a corresponding power bus 702.

Figure 5A:
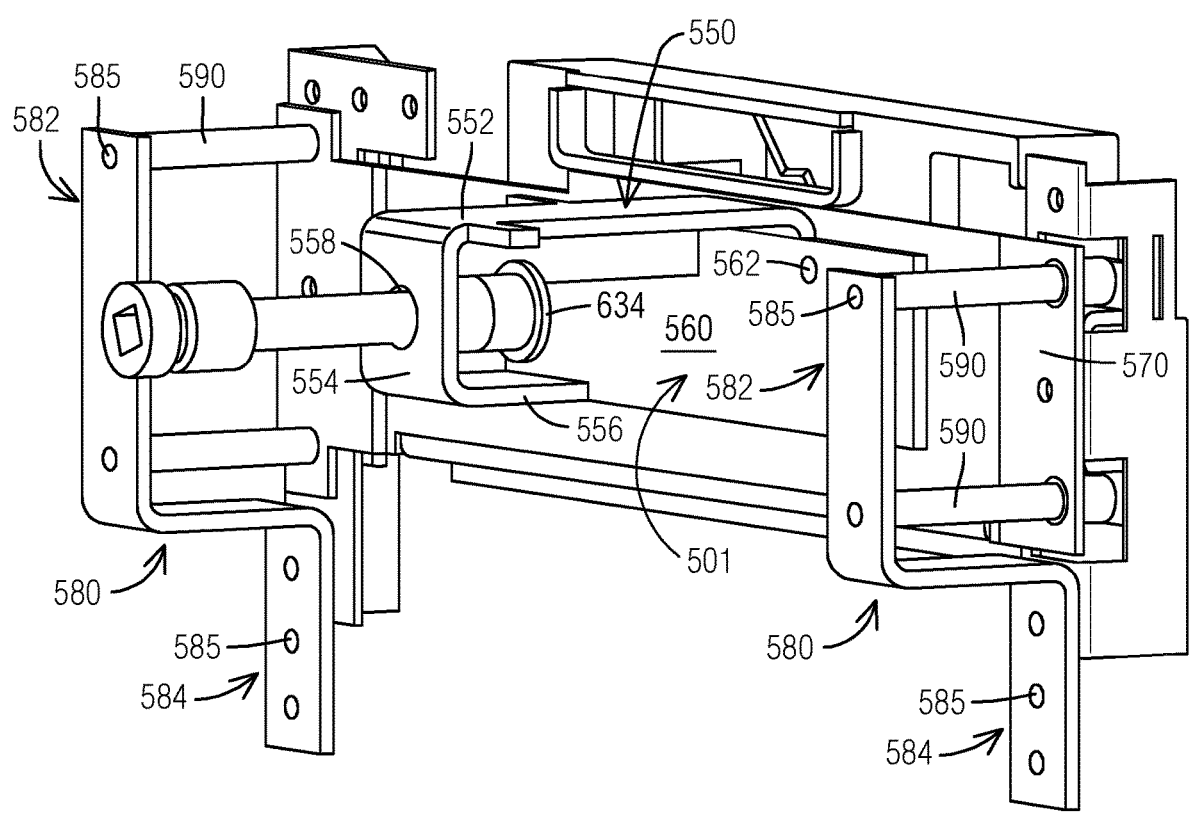
FIG. 5A illustrates a schematic, perspective view, of a lead screw assembly in an engaged position, in accordance with the disclosure provided herein.
Figure 5B:
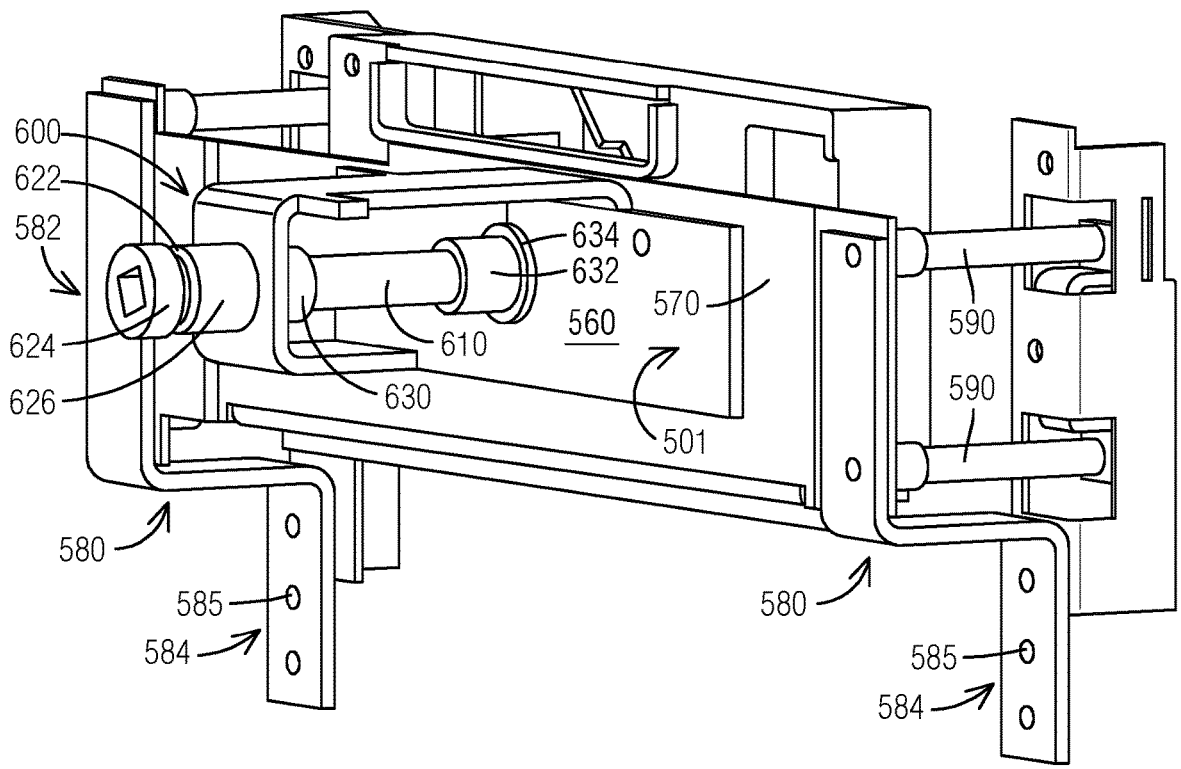
FIG. 5B illustrates a schematic, perspective view of the lead screw assembly of FIG. 5A in a disengaged position, in accordance with the disclosure provided herein.

Referring now to FIGS. 5A-B, the stab assembly 500 may further include a bracket assembly 501 and a lead screw bracket assembly or lead screw bracket 550. In one embodiment, the bracket assembly 501 includes a mounting plate 560 and a mounting bracket 570. In one embodiment, the lead screw bracket 550 may be a single-piece of material having one or more bends defining a first portion 552, second portion 554, and third portion 556, selectively coupled to the mounting plate 560. In a further embodiment, the first 552, second 554, and third portion 556, can be formed from separate pieces selectively attached to one another by, e.g., a fastening means, or be integrally formed as described herein.

In the embodiment of FIG. 5A, the first 552, second 554, and third portions 556 are formed from a single piece of material bent in a manner to define the first 552, second 554, and third portions 556. The first portion 552 may have a length greater than the second 554 and third portions 556, and may be attached to the mounting plate 560, mounting bracket 570, or both. The second portion 554 may be disposed between the first 552 and third portion 556, and includes a lead screw opening 558 adapted for at least partially receiving a lead screw 610 therebetween. The third portion 556 extends rearwardly from the second portion 554, and may be arranged substantially parallel to the first portion 552. The mounting plate 560 may be formed from a similar material to the lead screw bracket 550, and may include one or more fastening apertures 562 for selectively attaching the mounting plate 560 to the mounting bracket 570. The mounting plate 560 may be attached to the mounting bracket 570 by any of the fastening means described herein, or by other means known to persons having ordinary skill in the art. In one embodiment, the mounting plate 560 may have a thickness equal to or greater that the thickness of the mounting bracket 570, for providing support for the lead screw support bracket 550. However, it should be appreciated that a thinner mounting plate 560 may be used depending on engineering requirements for the MCU 200, and chosen with sound judgment.

The stab assembly 500 may include one or more guide rail brackets 580 for selectively attaching the stab assembly 500 to the back panel 220, and slideably engaging the mounting bracket 570. In an exemplary embodiment, the guide rail bracket 580 may include one or more bent portions defining a guide rail bracket upper portion 582, and a guide rail bracket lower portion 584. As illustrated in FIG. 5A, the guide rail bracket upper portion 582 may include a means for slideably engaging one or more stabs, i.e., one or more guide rails 590 extending rearwardly therefrom for slideably engaging the mounting bracket 570, and lower portion 584 may be adapted to interface or be mounted to the back panel 220 for securing the guide rail bracket 580 to the back panel 220. The guide rails 590 may be generally cylindrical, and adapted to be at least partially inserted between one or more openings (not shown) of the mounting bracket 570 for slideably engaging the mounting bracket 570 along the guide rails 590. In the embodiment of FIG. 5A, two guide rail brackets 580 are shown, with each guide rail bracket 580 having a pair of guide rails 590 extending rearwardly from a side of the guide rail brackets 580. The guide rail brackets 580 may include one or more openings 585 for at least partially receiving a fastening means therebetween, and for selectively mounting the guide rails 590 to the guide rail brackets 580. In a further embodiment, the guide rails 590 may be integral with the guide rail brackets 580, or be formed as a single piece.

The guide rails 590 may be selectively attached to the back panel 220 by one or more guide rail holders 592 (FIG. 6B). The guide rail holders 592 may have one or more bent portions defining at least a holder first portion 593 and a holder second portion 594. The holder first portion 593 may include an opening for at least partially receiving the guide rail 590 therebetween. The guide rail 590 may be selectively secured to the holder 592 by weld or any other means known to persons of ordinary skill in the art, and capable of securing the guide rail 590 to the holder 592. The guide rail holder second portion 594 may be adapted to interface with the upper portion 222 the back panel 220 to provide further support for selectively securing the stab assembly 500 to the back panel 220. In the embodiment of FIG. 6B, each guide rail 590 is shown having at least one guide rail holder 592 attached thereto for securing the same to the upper portion 222. It should be appreciated, that the guide rail holder 592 may be utilized for securing the guide rail 590, and not for restricting the slideable engagement between the guide rails 590 and the mounting bracket 570.

With continue reference to FIG. 5A, an exemplary embodiment of a lead screw assembly 600 is shown. The lead screw assembly 600 may comprise a lead screw 610 having a body portion 615 and a head portion, and one or more nuts or stoppers (630, 632) for limiting axial movement of the retractable stab assembly 500. The body portion 615 may be any shape, and have at least a portion thereof threaded for interfacing with a threaded portion of the stoppers (630, 632). In the embodiment of FIG. 5A, the body portion 615 is generally cylindrical, however, the body portion 615 may be any polygon shape known in the art. The head 620 may also be generally cylindrical or any polygon shape, and includes one or more voids or recesses 622 adapted to interface with a lead screw tool (not shown) or an actuating device (not shown). As shown in FIG. 5A, the void 622 defines a first head portion 624 and a second head portion 626. The void 622 may be non-uniform or uniform around the perimeter of the head 620, and may be adapted or sized such that at least a portion thereof is adapted to at least partially receives a portion of a first lead screw head support bracket 440 and a second lead screw head support bracket 442 (FIG. 3B) therebetween, for providing support for the lead screw assembly 600.

Figure 3B:
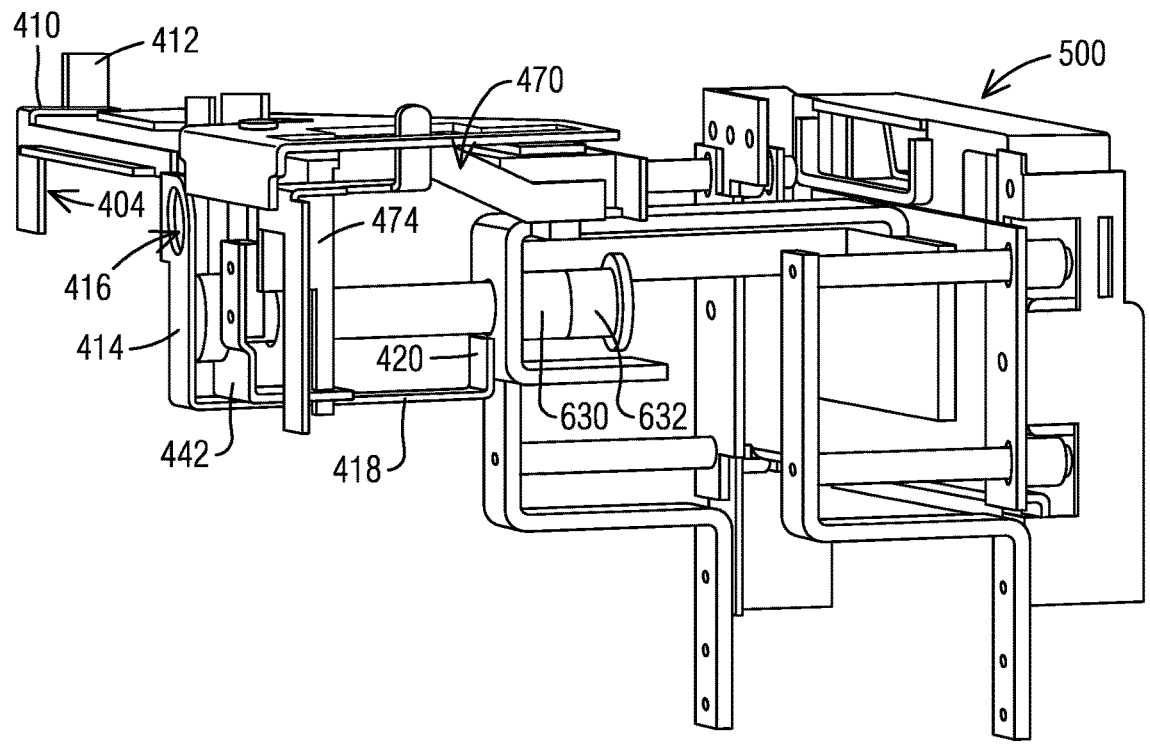
FIG. 3B illustrates another schematic, perspective view of the upper panel assembly of FIG. 3A with an inaccessible lead screw assembly via the upper panel assembly, in accordance with the disclosure provided herein.
Figure 3C:
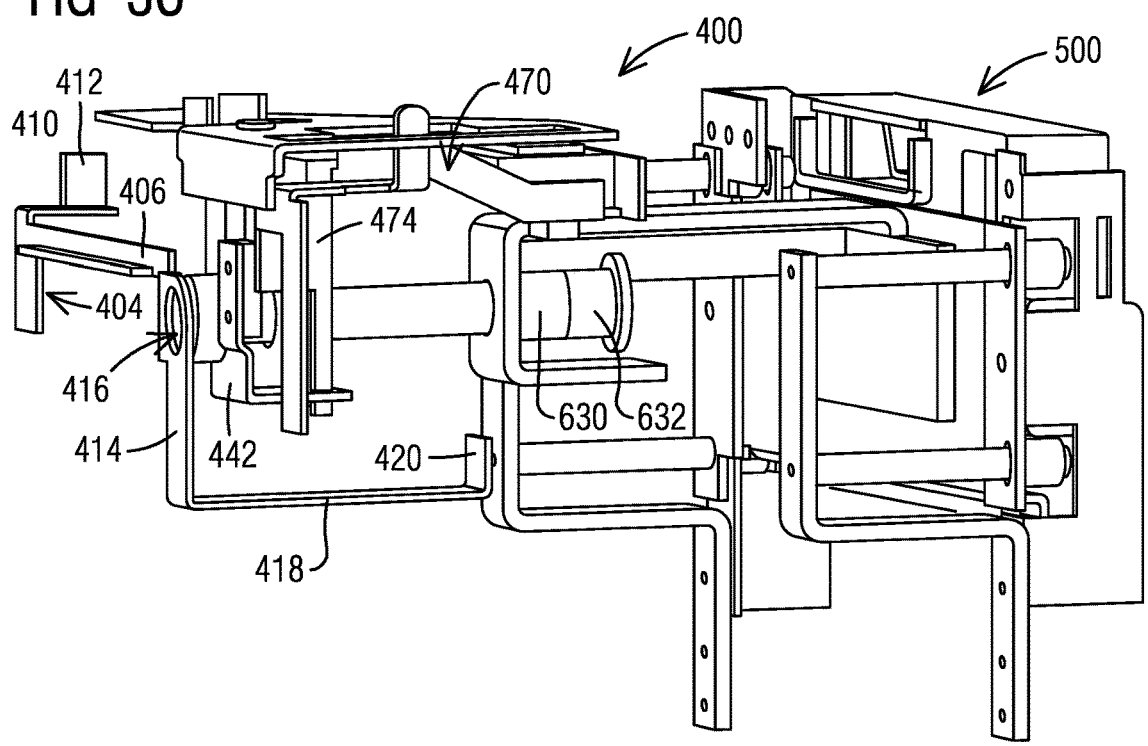
FIG. 3C illustrates a further schematic, perspective view of the upper panel assembly of FIG. 3A with an accessible lead screw assembly, in accordance with the disclosure provided herein.
Figure 3D:
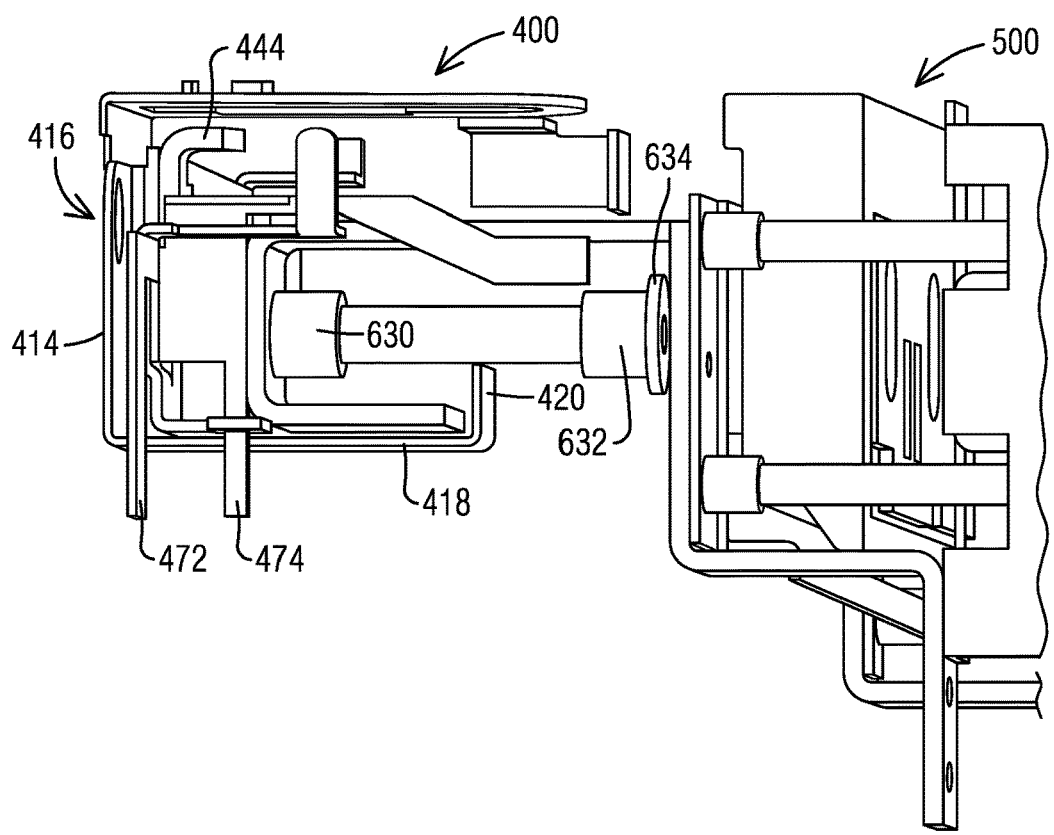
FIG. 3D illustrates yet a further schematic perspective view of the upper panel assembly of FIG. 3B with a disengaged stab assembly in accordance with the disclosure provided herein.

The first 440 and second 442 lead screw head brackets may be part of the lead screw assembly 600, or as shown in the embodiment of FIG. 3B, a part of the upper panel assembly 400. The first 440 and second 442 lead screw head support brackets may include one or openings for operably connecting to one or more adjacent panels of the MCU 200, or as shown in FIG. 3D, the upper panel assembly 400. The first lead screw head support bracket 440 may further include one or more bends defining a first upper portion 444 and second lower portion 445. The first upper portion 444 may be adapted to selectively attach the same to a structure in the upper panel assembly 400, e.g., via a fastening means. The structure may be moveable or fixed. The second lower portion 445 may be adapted to selectively attach the same to one or more openings in the second lead screw head support bracket 442.

In one embodiment, the first 440 and second 442 lead screw brackets may include at least a portion thereof having a polygonal or arcuate profile adapted to interface with the void 622, such that vertical and or horizontal movement of the head 620 may be limited. Similar to the first lead screw head support bracket 440, the second lead screw head support bracket 442 may include one or more bends defining at least a first bend portion 446 and a second bend portion 447. In the embodiment of FIG. 3C, the first bend portion 446 may include one or more openings for receiving a fastening means at least partially therebetween for selectively attaching the second lead screw head support bracket 442 to the first lead screw head support bracket 440.

The second bend portion 447 may further include one or more openings adapted for receiving a fastening means therebetween, or as shown in FIG. 3D, at least a portion of an indicator assembly 470 therebetween. Status indicators of the indicator assembly 470 may be viewed via the indicator opening 232. The indicator assembly 470 may be formed from a single-piece of material, or be formed from a plurality of frames selectively attached together by any of the fastening means described herein. The indicator assembly 470 may include a first indicator portion 472 having status indications (e.g., live, engaged, disengaged, dead etc.) for providing the status of the MCU 200, and a second indicator portion 474 adapted to operationally shift from a first position to a second position which may correspond with the shifting of at least a portion of the upper panel assembly 400, e.g., the access bracket 414.

The stoppers (630, 632) may be made from a metallic material similar to that of the lead screw body, or any material known to persons of ordinary skill in the art and adaptable to restrict movement of the lead screw 610 and/or stab assembly 500. The stoppers (630, 632) may also include a threaded portion corresponding with the threaded portion of the lead screw 610. The first stopper 630 may have a similar configuration to that of the second stopper 630.

In the embodiment of FIGS. 5A and 5B, at least one of the stoppers (630, 632), may be operably adapted to axially shift along the body portion 615 of the lead screw 610 when the stab assembly 500 shifts from a first engaged position (see FIG. 5A) to a second disengaged position (see FIG. 5B). The first stopper 630 and the second 632 may abut one another when the stab assembly 500 is in the engaged position (FIG. 5A), and be spaced apart when the stab assembly 500 is in the disengaged position (FIG. 5B). The first stopper 630 may be selectively mounted to the second portion 554 of the lead screw support bracket 550, e.g., via fastening means or welding, such that movement of the stab assembly 500 corresponds with the movement of the first stopper 630 along the axis of the lead screw. The second stopper may include a restrictor plate 634 mounted at one end of the second stopper 632 to restrict axial movement of the second stopper 632 along the lead screw 610. For example, the restrictor plate 634 in FIG. 5B may limit the lead screw 610 from extending beyond the restrictor plate 634 by not including an opening or having an opening with a smaller size (e.g., smaller diameter) that the diameter of the body portion 615.

Figure 7A:
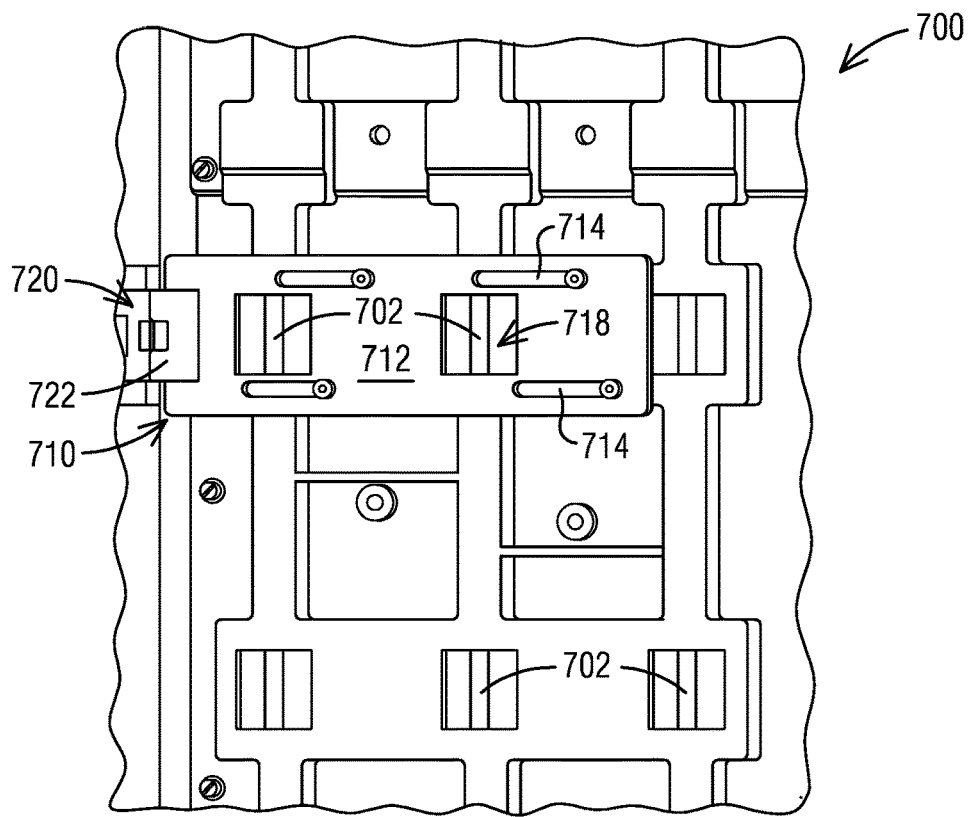
FIG. 7A illustrates a perspective view of a shutter assembly in a closed position, in accordance with the disclosure provided herein.
Figure 7B:
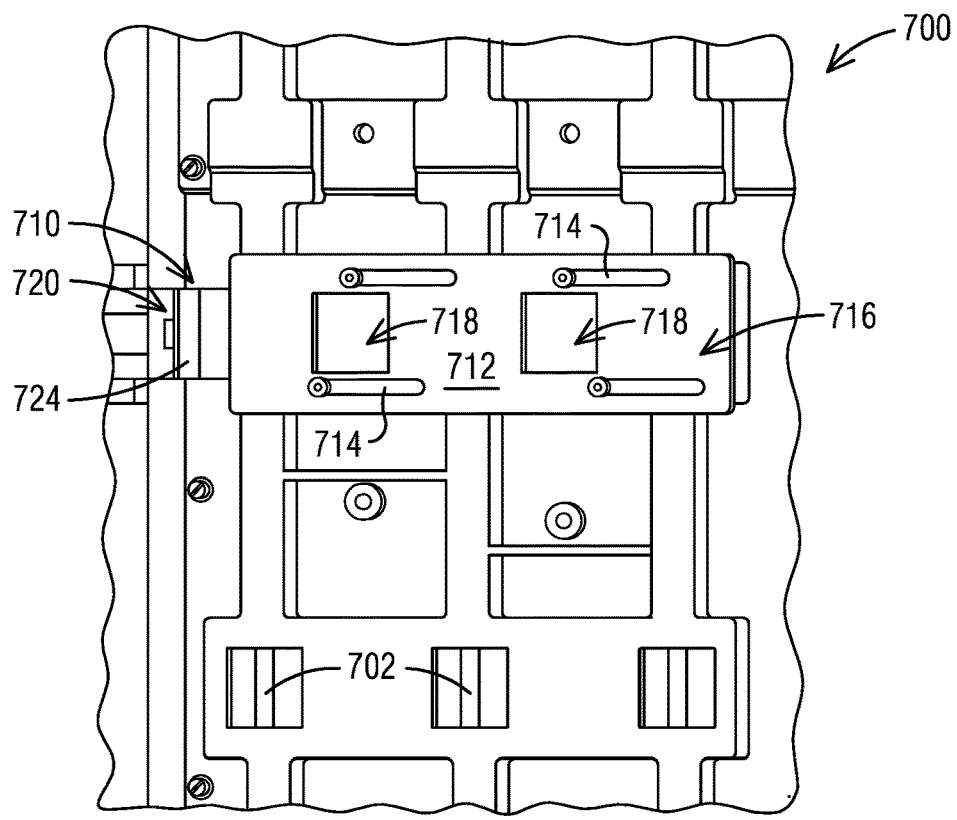
FIG. 7B illustrates a perspective view of the shutter assembly of FIG. 7A in an open position, in accordance with the disclosure provided herein.

Referring now to FIGS. 7A-B, front perspective views of a shutter assembly 710 are provided. The shutter assembly 710 may include a shutter plate 712 operably coupled to an access bracket assembly 720. The shutter plate 712 may include one or more fastening apertures 714 adapted for slideably mounting the shutter assembly 710 to the power bus housing 700. In the embodiment shown in FIGS. 7A-B, the shutter plate 712 includes at least four (4) fastening apertures 714 slideably mounting the shutter plate 712 to the power bus housing 700. The shutter plate 712 may further include one or more shields 716 for blocking access to one or more corresponding power buses 702 within the power bus housing 700 in a first position, e.g., a closed position. The shutter plate 712 further include one or more power bus apertures 718 that may be offset from the fastening apertures 714 for providing access to the power buses 702 in a second position, e.g., an open position. The power bus apertures 718 may be generally spaced an equidistance apart, and may be shaped/adapted to at least partially receive a stab 520 therebetween for interfacing with the power bus 702.

With continued reference to FIGS. 7A-B, the access bracket assembly 720 may further include an access bracket panel 722 having one or more access bracket frame fastening apertures (not shown) for selectively mounting the access bracket panel 722 to the power bus housing 700, or a structure proximate to the power bus housing 700. The access bracket panel 722 may include one or more grooves (not shown) adapted to slideably engage a means for moving the shutter plate 712 from the first position to the second position. In one embodiment, the means for moving the shutter plate 712 may be a biasing member (not shown), for example, a spring loaded mechanism configured for shifting the shutter plate 712 from the first position to the second position. The access bracket assembly 720 may further include an extender piece 724 adapted to interface with at least a portion of the stab assembly 500, e.g., the access arm or shoulder 518, for moving the shutter plate from a closed position to an open position when extending the retractable stab assembly 500 towards to the power bus housing 700 for engaging one or more stabs 520 with one or more corresponding power buses 702. In operation, the interfacing between the access shoulder 518 and the extender piece 724 may cause a spring of the spring mechanism to compress as the shutter plate 712 moves from the closed position to the open position.

With reference now to FIG. 8, an embodiment of a method 1000 for servicing a motor control unit is provided. It should be appreciated that following steps are not required to be performed in any particular order, and are hereby provided for exemplary purposes. For example, steps for disengaging one or more stabs may not be necessary where the stabs were previously disengaged, and/or where a motor control unit has previously been removed from its compartment.

In step 1010, moving the switch 310 from a first on position to a second off position. In this step, by moving the switch to the off position, power to one or more electrical components within the motor control unit may be interrupted. In an exemplary embodiment, moving the switch 310 to the second position may shift at least a portion of the upper panel assembly, e.g., the first support bracket 402, in a downwards direction thereby providing access to the lead screw 610 via the access bracket 414. In step 1020, disengaging the stabs 520 from the power bus 702. In embodiments where the motor control unit includes fixed stabs, pulling out the motor control unit via a handle, for example, may disengage the stabs. In embodiments where the MCU 200 includes the retractable stab assembly 500, the step of disengaging the stabs may include the step of: inserting at least a portion of a lead screw tool into the opening 416, and shifting (e.g., rotating) the lead screw 610 from a first position to a second position, thereby retracting the stab assembly 500 in a direction towards the front panel 210, and disengaging the stabs 520 from the power bus 702.

In step 1030, removing the MCU 200 from the MCC section 110. As previously described, in embodiments of the motor control units having fixed stabs, removing the motor control unit may inherently disengage the stabs. In step 1040, disassembling the stab assembly. In step 1050, installing the retractable stab assembly 500 in the MCU 200. In step 1060, at least partially inserting the MCU 200 having the retractable stab assembly 500 into the compartment of the MCC section 110, and engaging one or more stabs 520 with the power bus 702. In this step, engaging the one or more stabs may be accomplished by extending the stab assembly 500 rearwardly by, for example, rotating the lead screw 610 in an engaging direction.

Figure 9:
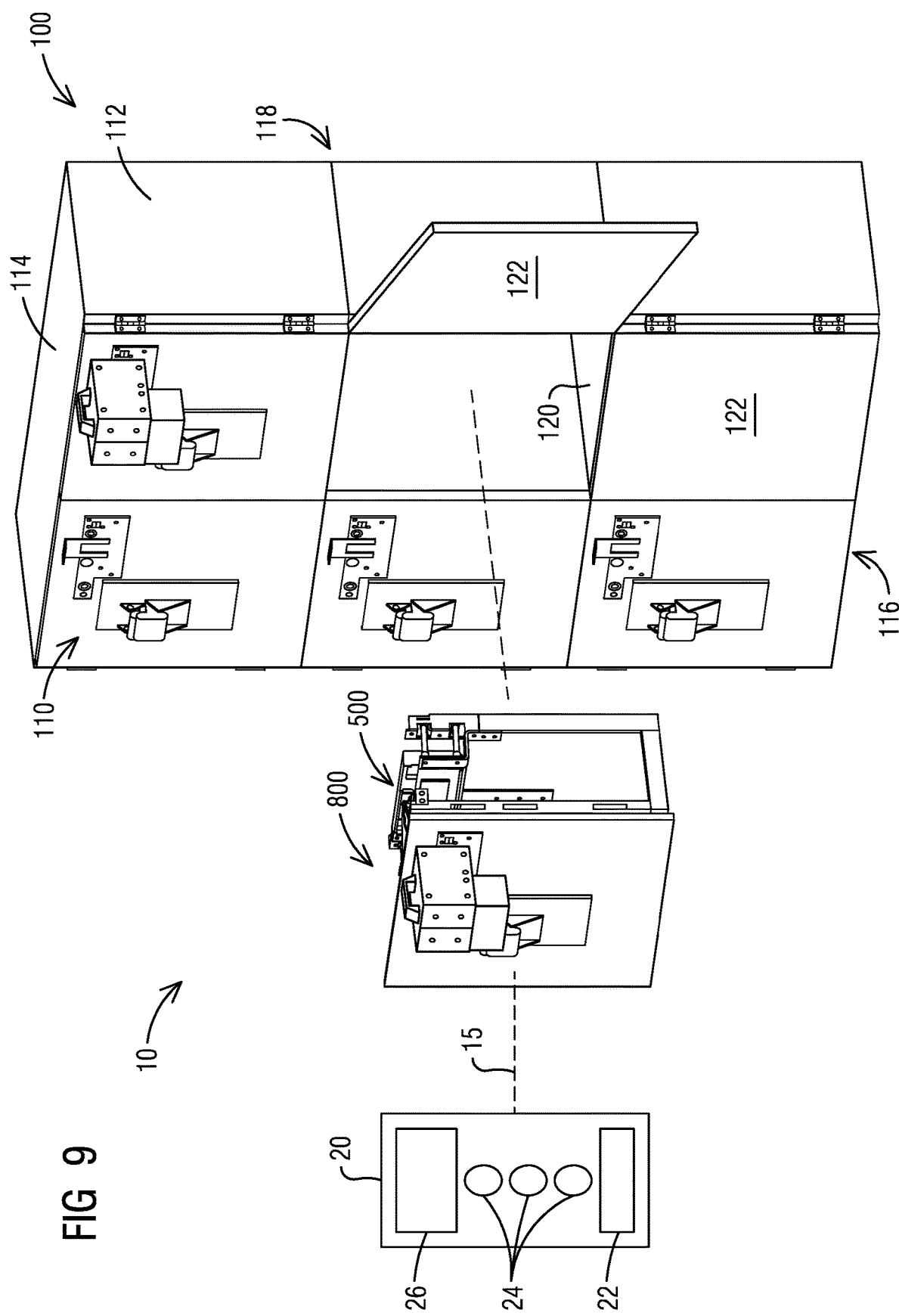
FIG. 9 illustrates an exemplary embodiment of a remote-controlled system for operating an embodiment of the motor control unit, in accordance with the disclosure provided herein.

With continued reference to the figures and now FIG. 9, an exemplary embodiment of a remote-controlled system 10 for operating an embodiment of the MCU 200 is provided. The system 10 may include a remote-device or pendant 20 operatively connected to one or more embodiments of a motorized MCU 200, i.e., a motorized control unit 800. The connection 15 between the pendant 20 and the motorized control unit 800 may be wired, via one or more cables, or wireless, via one or more wireless transceiver of the motorized control unit 800 and the pendant 20.

In one embodiment, the pendant 20 may include a memory (not shown) for storing executable instructions, e.g., instructions to activate and deactivate the motorized control unit 800, and a processing circuit operable to execute the stored instructions. The pendant 20 may further include one or more buttons or control knobs 24 for operating the motorized control unit 800. In operation, shifting the button or knob 24 may cause the processing circuit to execute instructions corresponding to the shift, e.g., a shift in the first direction may activate the motorized control unit 800, while a shift in a second direction may deactivate the motorized control unit 800. It should be appreciated, that execution of the instructions may generate control signals which are transmitted to the motorized control unit 800 for operating the same. The control signals may be transmitted to the motorized control unit 800 via one or more cables in a wired connection or via the wireless transceiver in a wireless network environment. The pendant may further include one or more indicators 22 for identifying a status of the motorized control unit, i.e., whether the motorized control unit 800 is active (stabs engaged) or inactive (stabs disengaged). The pendant 20 may also include a display 26 for displaying the status of the motorized control unit 800.

Figure 10:
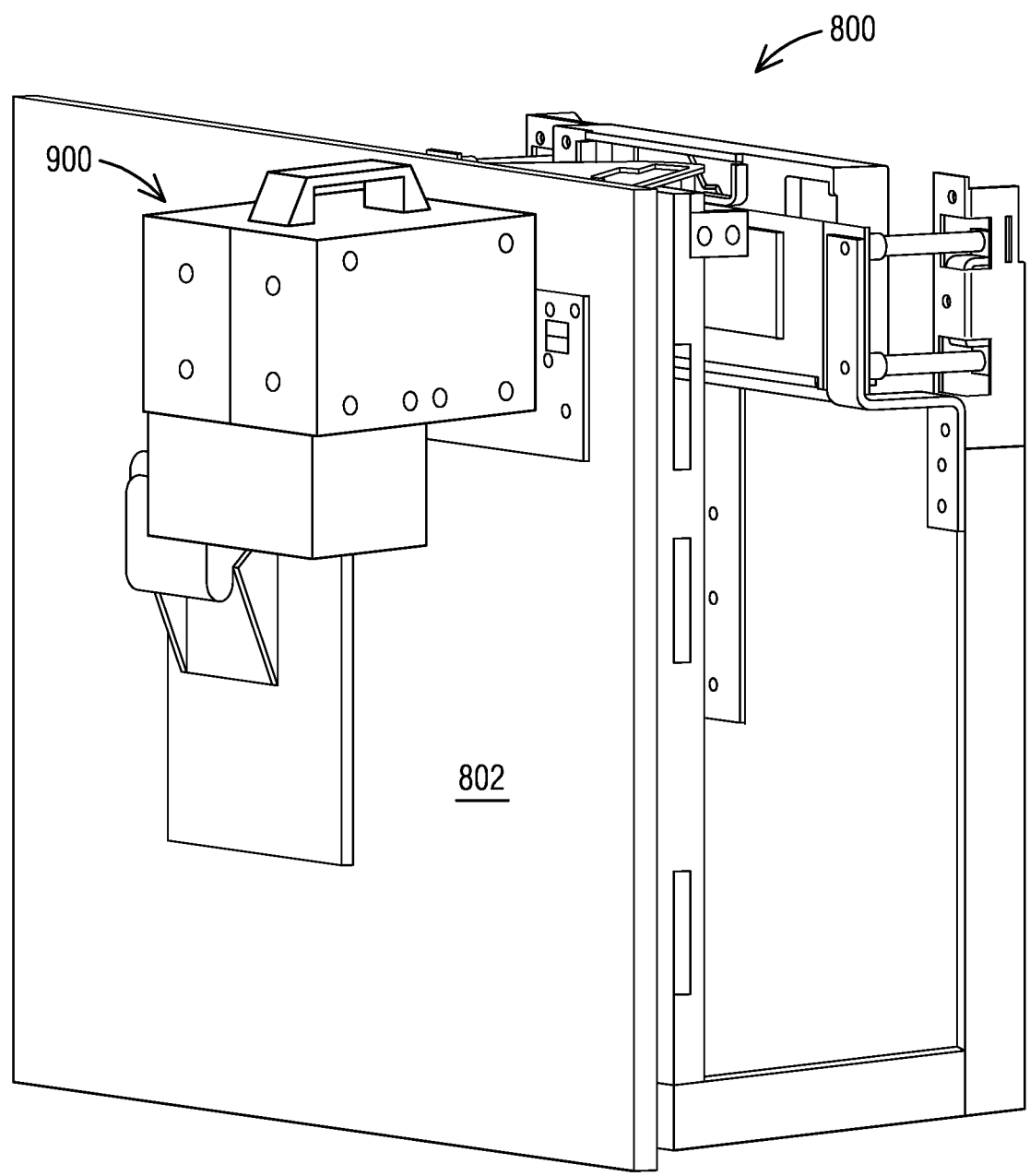
FIG. 10 illustrates a perspective view of a motorized control unit, in accordance with the disclosure provided herein.
Figure 11:
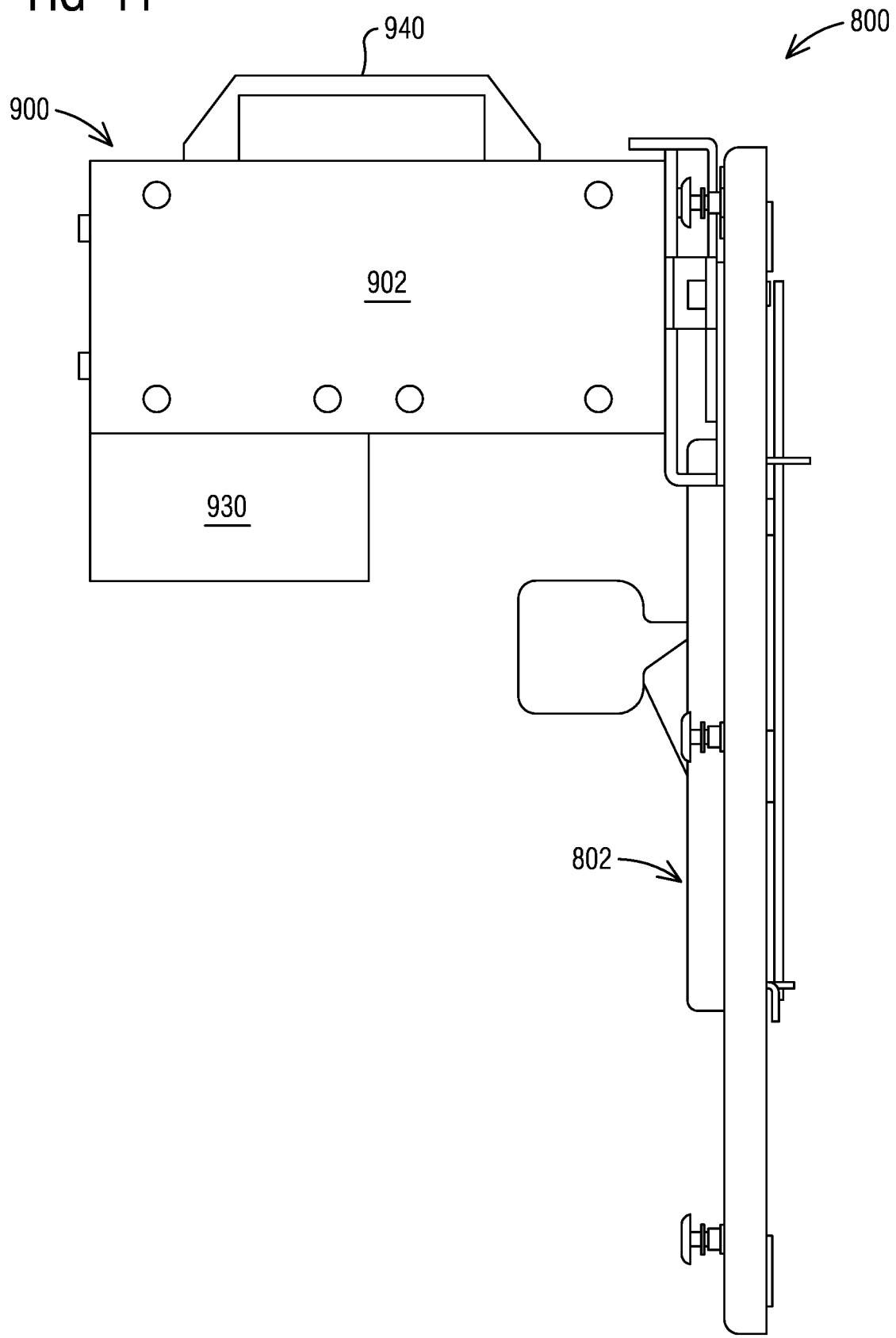
FIG. 11 illustrates a side perspective view of an embodiment of a motor assembly operatively attached to a motor control unit, in accordance with the disclosure provided herein.
Figure 12:
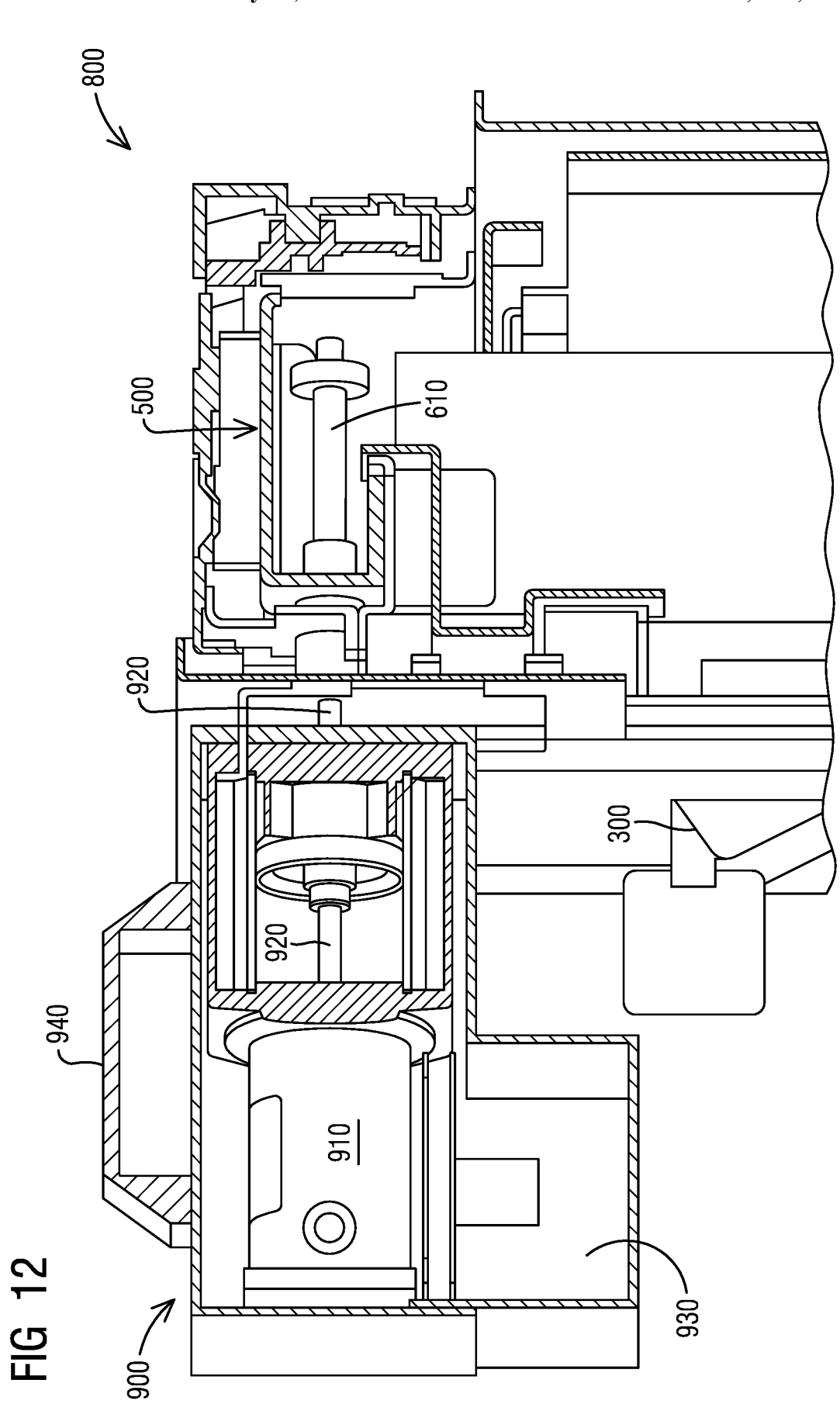
FIG. 12 illustrates a side cross-sectional view of an embodiment of the motorized control unit, in accordance with the disclosure provided herein.
Figure 13:
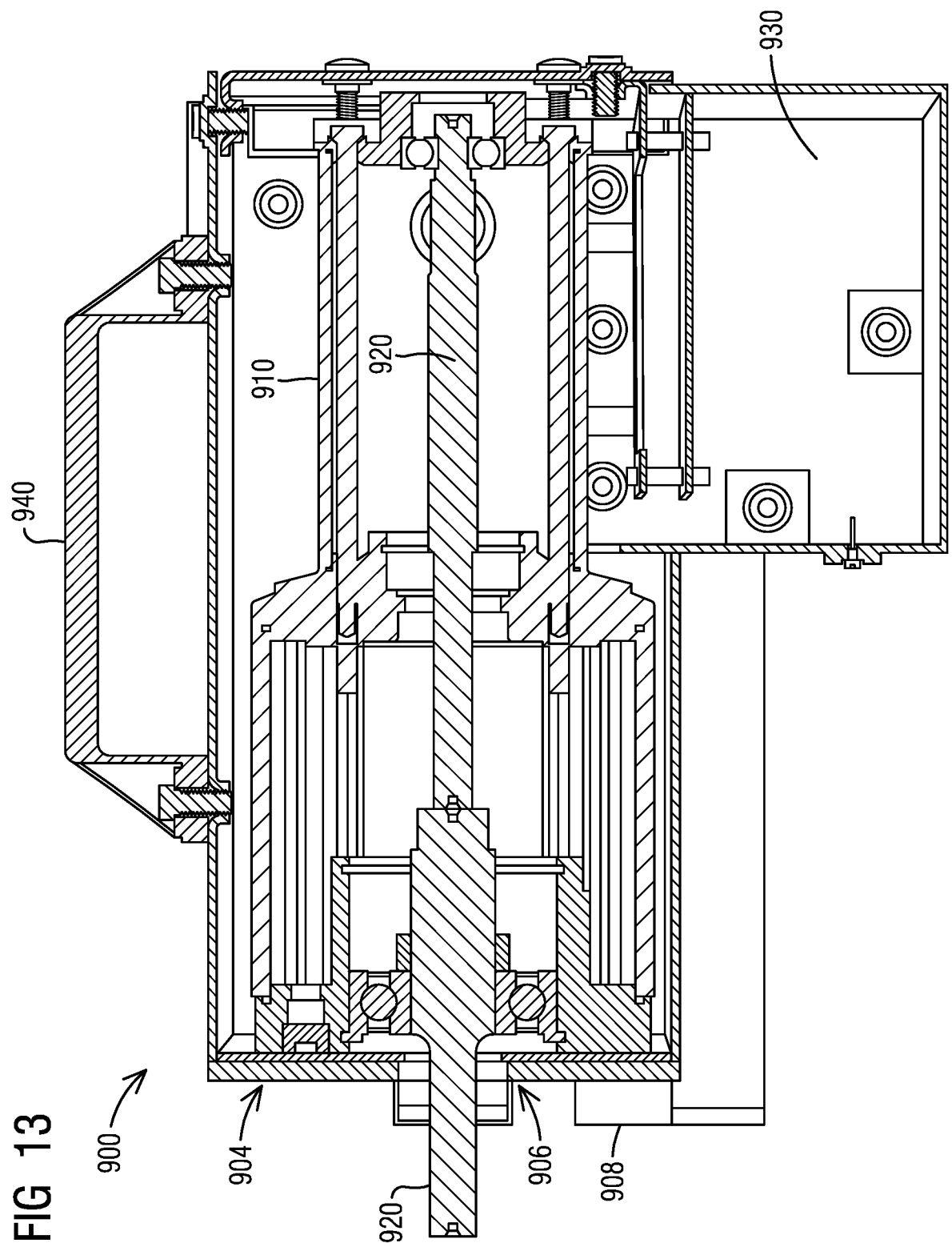
FIG. 13 illustrates a side cross-sectional view of a motor assembly, e.g., of the motorized control unit, in accordance with the disclosure provided herein.

With reference to FIG. 10, an embodiment of the motorized control unit 800 is provided. The motorized control unit 800 may be similar to the MCU 200 in that in may include a housing 802 adapted to at least partially enclose one or more electrical components therein, e.g., the switch assembly 300, upper panel assembly 400, retractable stab assembly 500, and lead screw assembly 600. In the embodiment of FIG. 10, in addition to the sub assemblies, the motorized control unit 800 comprise a motor assembly 900 operatively connected to a front panel of the housing 802.

The motor assembly 900 may include a drive motor 910 operatively connected to a drive shaft 920 and power adapter 930. The power adapter 930 may include one or more openings adapted to receive one or more cables for operating the motor assembly 900. The cables may be cables operatively connected to the pendant 20 for facilitating the transmission of the control signals to drive the drive motor 910. Additional cables may also be operatively connected to the power module 930 for connecting to a power source for powering the electrical components within a housing 902 of the motor assembly 900, e.g., the drive motor 910. In yet a further embodiment, the motor assembly 900 may be powered by a battery or other means for powering a drive motor 910 known to persons of ordinary skill in the art. In yet a further embodiment, the power adapter 930 may include a wireless transceiver for facilitating the wireless communication between the pendant 20 and the motor assembly 900.

With continued reference to the figures and now FIGS. 11-14, the drive motor 910 may be operatively connected to the pendant 20 for receiving control signals for providing a motive force to rotate the drive shaft 920 in multiple directions to operate the motorized control unit 800. In an exemplary embodiment, the drive shaft 920 may extend rearwardly from the housing 902 such that the drive shaft 920 interfaces with the lead screw 610. In yet a further embodiment, the housing 902 may include back plate 904 with a drive shaft opening 906 adapted for the drive shaft 920 to extend at least partially therethrough for interface with the lead screw 610 when the motor assembly 900 is attached to the motorized control unit 800. It should be appreciated, in a further embodiment, that one or more seals or adapters may be provided at the drive shaft opening 906 for interfacing with or supporting the drive shaft 920 extending rearwardly therefrom. The housing 902 may further include one or more mounting brackets 908 disposed on opposite sides of the housing 902 for selectively attaching the motor assembly 900 to the front of the housing 802.

In one embodiment, the mounting brackets 908 may include a recess having an arcuate profile for interfacing with one or more mounting arm (not shown) on the front of the housing 802 for attaching the motor assembly. It should be appreciated that in addition to or in lieu of the recess, the mounting brackets 908 may further include an aperture or hole for receiving fasteners for securing the motor assembly 900 to the housing 802, via a corresponding aperture adapted for receiving the fasteners. In yet a further embodiment, the mounting brackets 908 may be attached to or integrally formed with the back plate 904 for attaching the motor assembly 900 to the motorized control unit 800. A handle 940 may also be provided at an upper portion of the housing 902 for facilitating the attaching and removal of the motor assembly 900 from the housing 802.

In yet a further embodiment, the operability of the motor assembly 900 may correspond with the functionality of the switch assembly 300, and more particularly, the switch 310, and e.g., whether or not it is in an on or off position. For example, in one exemplary embodiment, an operator may not be able to switch the switch assembly 300 on unless the retractable stab assembly is fully retracted or extended. Additionally, the switch 310 may also not be moveable to the on position if the lead screw 610 is being rotated, e.g., by the drive shaft or any external tool. In yet a further exemplary embodiment, no access to the lead screw access opening 218 may be provided if the switch is in the on position, thus the motor assembly 900 may not be able to attach to the front of the housing 802 because the drive shaft 920 may not have access to the lead screw 610 with a closed/blocked lead screw access opening 218.

With continued reference to the figures, the drive shaft 920 may extend rearwardly beyond the back of the housing 902 or back plate 904 to allow for the drive shaft 920 to be at least partially inserted into the lead screw access opening 218. Once the drive shaft is inserted into the lead screw access opening 218, the drive shaft may interface or engage the lead screw 610 such that rotation of the drive shaft 920, via the drive motor 910, causes the lead screw 610 to rotate, which extends and retracts the retractable stab assembly 500 to engage and disengage the stabs. In yet a further embodiment, the drive shaft 920 may be used in lieu of the lead screw 610 in that the drive shaft 920 may extend at least partially through the lead screw opening 558 for attaching the extended drive shaft 920 to the stoppers 630, 632, for limiting axial movement of the retractable stab assembly 500 in operation.

With reference now to FIG. 15, a flow chart for a method 1500 of disengaging stabs of an exemplary embodiment of the motorized control unit is provided. It should be appreciated that following steps are not required to be performed in any particular order, and are hereby provided for exemplary purposes.

In step 1510, the drive motor 910 is initiated, via the pendant 20, to engage the stabs of the retractable stab assembly 500. It should be appreciated that if the motor assembly 900 has not been previously attached to the motorized control unit 800, or more particularly the housing 802, an operator may attach the motor assembly 900, e.g., using the handle 940, to the housing 802 prior to initiating the drive motor 910. It should further be appreciated, as described herein, that before attaching the motor assembly 900, the motorized control unit 800 switch 310 should be in the off position, which allows for the drive shaft 920 to extend through the lead screw access opening 218 to engage the lead screw 610. Upon attaching the motor assembly 900, the operator may initiate the drive motor 910 by selecting a button or shifting the knob 24 in a first direction to extend the retractable stab assembly 500 rearwardly towards the power bus 702 to engage the stabs with the power bus 702. Shifting the knob 24 may cause the processing circuit of the pendant 20 to execute instructions for rotating the drive shaft 920 and to generate control signals corresponding to the instructions. The control signals may then be transmitted to the motor assembly 900, or more particularly the drive motor 910, from the pendant 20, which rotates the drive shaft 920 in a first direction to engage the stabs with the power bus 702. In this embodiment, rotation of the drive shaft 920 causes the lead screw 610 to rotate, which results in the retractable stab assembly 500 shifting along the guide rails 590 in a direction to engage the stabs.

Once the stabs are engaged, in step 1520, a confirmation of the successful engagement may be transmitted from the motorized control unit 800 to the pendant 20 and displayed, e.g., on the display 26. The successful engagement/connection confirmation from the motor assembly 900 may be based on or results from, e.g., the lead screw 610 no longer being rotated in the engaging direction, i.e., the lead screw 610 has stop rotating in a direction extending the retractable stab assembly 500 towards the power bus 702. It should also be appreciated that the lead screw 610 no longer rotating in the disengaging direction may be indicative of the retractable stab assembly being in the fully retracted position and the stabs being disengaged from the power bus 702. It should further be appreciated that other circuitry may be provided and activated upon the retractable stab assembly 500 being in a fully extended and engaged position, or fully retracted and disengaged position. The circuitry may then transmit this information, i.e., the assembly is fully extended, as an engagement signal to the connected pendant 20 for engagement confirmations, and as a disengagement signal for disengagement confirmations.

In step 1530, the operator may then remove the motor assembly 900, e.g., via the handle 940, from the motorized control unit 800, or more particularly, the housing 802, and upon receiving the engagement signal from the motorized control unit 800 or motor assembly 900. In a further embodiment, to disengage the motorized control unit 800, in step 1540, the operator may switch the switch 310 to the off position, which provides access to the lead screw 610, via the lead screw access opening 218 being available with the switch 310 in the off position. The operator may then attach the motor assembly 900 to the housing 802 such that the drive shaft 920 extends through the lead screw access opening 218 and interfaces with the lead screw 610. The operator may then begin retracting the retractable stab assembly 500 to disengage the stabs from the power bus 702. To begin retracting the stab assembly 500, the operator may select a button or shift the knob 24 which may generate and transmit a disengage control signal from the pendant 20 to the motor assembly 900 which causes the drive motor 910 to rotate the lead screw 610, e.g., by way of the drive shaft 920, in a direction opposite the engagement direction or a further direction, which retracts the retractable stab assembly 500 away from the power bus 702 along an axis of the guiderails.

It should be appreciated that one button or knob 24 may be used on the pendant 20 for extending or retracting the retractable stab assembly 500. It should further be appreciated that a further signal may be transmitted from the motorized control unit 800 or motor assembly 900 to the pendant 20 identifying that the motorized control unit 800 is disengaged, i.e., the disconnection between the stabs and the power bus 702 is complete. Once the stabs have been disengaged from the power bus 700, the motor assembly 900 may be removed from the motorized control unit 800, via the handle 940.

With reference now to FIG. 16, an embodiment of a method 1600 for assembling an embodiment of the MCU 200 is provided. The modularity of the sub-assemblies, e.g., the upper panel assembly 400, retractable stab assembly 500, etc., allows for the sub-assemblies to fit any size/type MCU 200 or motorized control unit 800. This versatility allows for these sub-assemblies to be mass produced for any embodiment of the control units described herein.

In step 1610, the method 1600 includes the step of: selectively attaching an embodiment of the retractable stab assembly 500 to a rear of the MCU 200 such that the stab assembly 500 and/or one or more stabs extending therefrom, are positioned to extend in a rearward direction from the housing or an opening in the housing to engage a power source, e.g., power bus 702. In this step, as described herein, the retractable stab assembly 500 may be secured to a rear panel or other structure in the MCU 200 such that the stabs may extend rearwardly to engage the power source. One or more fasteners may be used to secure the stab assembly 500 and/or any of the other sub-assemblies in the MCU 200. In step 1620, the method 1600 may include the step of: selectively attaching an upper panel assembly 400 to an upper part of the housing, the upper panel assembly 400 including an access bracket for limiting access to a lead screw; and a support bracket coupled to the access bracket and adapted to restrict removal of the motor control unit.

With continued reference to the figures, in step 1630, the method 1600 may include the step of: selectively attaching a switch assembly 300 to a front of the housing, the switch assembly 300 including a switch moveable to an on and off position and operatively connected to the upper panel assembly 400, e.g., one of the support and access bracket, and any electrical components within the housing. In step 1640, the method 1600 may also include the step of: selectively attaching a motor assembly 900 to the front of the housing and adjacent the switch assembly 300, the motor assembly 900 including a drive motor 910 coupled to a drive shaft 920, wherein the drive shaft 920 extends in a rearward direction from the motor assembly 900 and through an opening in the access bracket for engaging the lead screw, e.g., when the switch is in the off position.

While specific embodiments have been described in detail, those with ordinary skill in the art will appreciate that various modifications and alternative to those details could be developed in light of the overall teachings of the disclosure. For example, elements described in association with different embodiments may be combined. Accordingly, the particular arrangements disclosed are meant to be illustrative only and should not be construed as limiting the scope of the claims or disclosure, which are to be given the full breadth of the appended claims, and any and all equivalents thereof. It should be noted that the terms "comprising", "including", and "having", are open-ended and does not exclude other elements or steps; and the use of articles "a" or "an" does not exclude a plurality.

I claim:

1. A method for assembling a retractable stab assembly for a motor control unit comprising the steps of:
mounting a bracket assembly of the retractable stab assembly to a stab housing having one or more slots for receiving stabs therebetween, the bracket assembly comprising:
a mounting plate secured to a side of the stab housing opposite the one or more slots; a rail bracket adapted to attach to a rear of the motor control unit and having one or more guide rails extending rearwardly therefrom; and a lead screw bracket defining a first portion and a second portion extending substantially perpendicularly from the first portion towards the rear of the motor control unit, the second portion being attached to a side of the mounting plate opposite the stab housing, wherein the second portion has a lead screw opening; and
securing a lead screw assembly of the retractable stab assembly to the bracket assembly, the lead screw assembly comprising:
a lead screw having a head and body portion; a nut having an opening for receiving the lead screw therein; and a stopper adapted to interface with the body portion; wherein the nut is mounted to the first portion of the lead screw bracket such that the nut opening is aligned with the lead screw opening; wherein the body portion of the lead screw is inserted through the lead screw opening and the nut opening and is secured to the second stopper at an end of the body portion to restrict movement of the lead screw beyond the stopper; and wherein the lead screw is rotatable such that rotation of the lead screw shifts the first portion and nut along the body portion of the lead screw.

2. The method of claim 1, wherein the nut is mounted to a rearward facing side of the first portion resulting in the head portion being on an opposite side of the first portion than the nut.

3. The method of claim 1 further comprising the step of: attaching stabs to the one or more slots in the stab housing.

4. A method for assembling a motor control unit having a housing adapted to receive one or more electrical components therein, comprising the steps of:

attaching the retractable stab assembly according to claim 1 to a rear panel of the stab housing such that attached stabs are positioned to extend rearwardly from the stab housing to engage a power source.

5. The method of claim 4, wherein the motor control unit is one of a 12, 18, 24, 30, 36, 42, 48, 54, and 60 inch unit.

6. The method of claim 5, wherein a rear panel for the 12, 18, 24, 30, 36, 42, 48, 54, or 60 inch units comprises an opening adapted for the one or more stabs of the retractable stab assembly to at least partially extend rearwardly therethrough.

7. The method of claim 6, wherein the opening of the 12, 18, 24, 30, 36, 42, 48, 54, or 60 inch units is similarly dimensioned.

8. The method of claim 6, wherein the opening of the 12, 18, 24, 30, 36, 42, 48, 54, or 60 inch units is differently dimensioned.

9. The method of claim 4, wherein the nut is mounted to a rearward facing side of the first portion resulting in the head portion being on an opposite side of the first portion than the nut.

10. The method of claim 4 further comprising the step of: attaching an upper panel assembly to an upper part of the housing.

11. The method of claim 10, wherein the upper panel assembly comprises:
a support bracket operatively coupled to an access bracket, wherein the support bracket is adapted to restrict movement of the motor control unit, and wherein the access bracket is adapted to restrict movement of the retractable stab assembly.

12. The method of claim 10 further comprising the step of: attaching a switch assembly to a front of the housing.

13. The method of claim 12, wherein the switch assembly comprises:
a switch moveable to an on and off position and operatively connected the support bracket, the access bracket, and the one or more electrical components in the housing for controlling power flowing to the one or more electrical components from a power source; and
a lead screw access opening adapted to provide access to the lead screw within the housing.

14. The method of claim 13, wherein access to the lead screw is provided, via the lead screw access opening, when the switch is in the off position.

15. The method of claim 13, wherein the access bracket is further adapted to limit access to the lead screw, via one of the lead screw opening and the lead screw access opening, when the switch is in the on position.

16. The method of claim 12 further comprising the step of: attaching a motor assembly to the front of the housing and adjacent to the switch assembly.

17. The method of claim 16, wherein the motor assembly comprises:
a drive motor coupled to a drive shaft, and wherein the drive shaft extends in a rearward direction from the motor assembly and through a lead screw access opening in the front of the housing to engage the lead screw.

* * * * *